(12) United States Patent
Ishihara et al.

(10) Patent No.: US 10,477,682 B2
(45) Date of Patent: Nov. 12, 2019

(54) PRINTED WIRING BOARD AND METHOD FOR MANUFACTURING THE SAME

(71) Applicant: IBIDEN CO., LTD., Ogaki (JP)

(72) Inventors: Teruyuki Ishihara, Ogaki (JP); Shunsuke Sakai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/245,336

(22) Filed: Jan. 11, 2019

(65) Prior Publication Data

US 2019/0215958 A1 Jul. 11, 2019

(30) Foreign Application Priority Data

Jan. 11, 2018 (JP) .................................. 2018-002740

(51) Int. Cl.
| | |
|---|---|
| *H05K 1/14* | (2006.01) |
| *H05K 1/11* | (2006.01) |
| *H05K 3/40* | (2006.01) |
| *H05K 3/46* | (2006.01) |
| *H05K 1/03* | (2006.01) |

(52) U.S. Cl.
CPC ............ *H05K 1/114* (2013.01); *H05K 1/036* (2013.01); *H05K 1/116* (2013.01); *H05K 3/4015* (2013.01); *H05K 3/4655* (2013.01); *H05K 3/4682* (2013.01); *H05K 3/4697* (2013.01)

(58) Field of Classification Search
CPC ........ H05K 1/114; H05K 1/036; H05K 1/116; H05K 3/4015; H05K 3/4655; H05K 3/4682; H05K 3/4697

USPC ........................................................ 174/261
See application file for complete search history.

(56) References Cited

U.S. PATENT DOCUMENTS

| | | | |
|---|---|---|---|
| 2002/0145197 A1* | 10/2002 | Ohta ................. | H01L 23/49833 257/734 |
| 2010/0078786 A1* | 4/2010 | Maeda .................... | H01L 23/16 257/678 |
| 2010/0208442 A1* | 8/2010 | Asano ................... | H01L 21/563 361/783 |

FOREIGN PATENT DOCUMENTS

JP      2016-086024 A     5/2016

* cited by examiner

*Primary Examiner* — Tremesha S Willis
(74) *Attorney, Agent, or Firm* — Oblocn, McClelland, Maier & Neustadt, L.L.P.

(57) ABSTRACT

A printed wiring board includes a build-up layer including an insulating layer and a first conductor layer including a component mounting pad, a covering layer formed on the build-up layer such that the covering layer is covering the insulating layer and has opening exposing the pad, a reinforcement layer formed on the covering layer and having cavity exposing the pad and the covering layer, a conductor layer formed on the reinforcement layer such that the conductor layer is on the opposite side of the covering layer on the build-up layer, and a via conductor formed in the reinforcement layer such that the via conductor electrically connects the first conductor layer and conductor layer on the reinforcement layer. The first conductor layer is embedded in the insulating layer forming a surface of the build-up layer such that the first conductor layer has surface exposed on the surface of the build-up layer.

15 Claims, 15 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2018-002740, filed Jan. 11, 2018, the entire contents of which are incorporated herein by reference.

BACKGROUND OF THE INVENTION

Field of the Invention

The present invention relates to a printed wiring board and a method for manufacturing the printed wiring board.

Description of Background Art

Japanese Patent Laid-Open Publication No. 2016-86024 describes a printed wiring board in which circuit substrates are laminated. One of the circuit substrates has an opening (cavity) that penetrates the circuit substrate and exposes an electronic component mounting area of the other circuit substrate. On the bottom of the cavity, bottoms of mounting via conductors that respectively form pads for connecting to an electronic component are recessed relatively to the bottom surface and are exposed. The entire contents of this publication are incorporated herein by reference.

SUMMARY OF THE INVENTION

According to one aspect of the present invention, a printed wiring board includes a build-up layer including an insulating layer and a first conductor layer embedded in the insulating layer and including a component mounting pad, a covering layer formed on the build-up layer such that the covering layer is covering the insulating layer of the build-up layer and has an opening exposing the component mounting pad, a reinforcement layer formed on the covering layer and having a cavity penetrating through the reinforcement layer such that the cavity is exposing the component mounting pad in the build-up layer and the covering layer on the build-up layer, a conductor layer formed on the reinforcement layer such that the conductor layer is on the opposite side with respect to the covering layer on the build-up layer, and a via conductor formed in the reinforcement layer such that the via conductor electrically connects the first conductor layer in the build-up layer and the conductor layer on the reinforcement layer. The first conductor layer is embedded in the insulating layer forming a surface of the build-up layer such that the first conductor layer has a surface exposed on the surface of the build-up layer.

According to another aspect of the present invention, a method for manufacturing a printed wiring board includes preparing a laminate including a reinforcement layer, a build-up layer including a covering layer, an insulating layer, a first conductor layer, and a release film, forming a groove penetrating through the reinforcement layer along a peripheral edge of the release film over an entire circumference of the release film from a surface of the reinforcement layer on the opposite side with respect to the build-up layer, and removing a portion of the reinforcement layer surrounded by the groove together with the release film such that a cavity penetrating through the reinforcement layer is formed. The release film allows a portion of the reinforcement layer and the build-up layer to be peeled off from each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
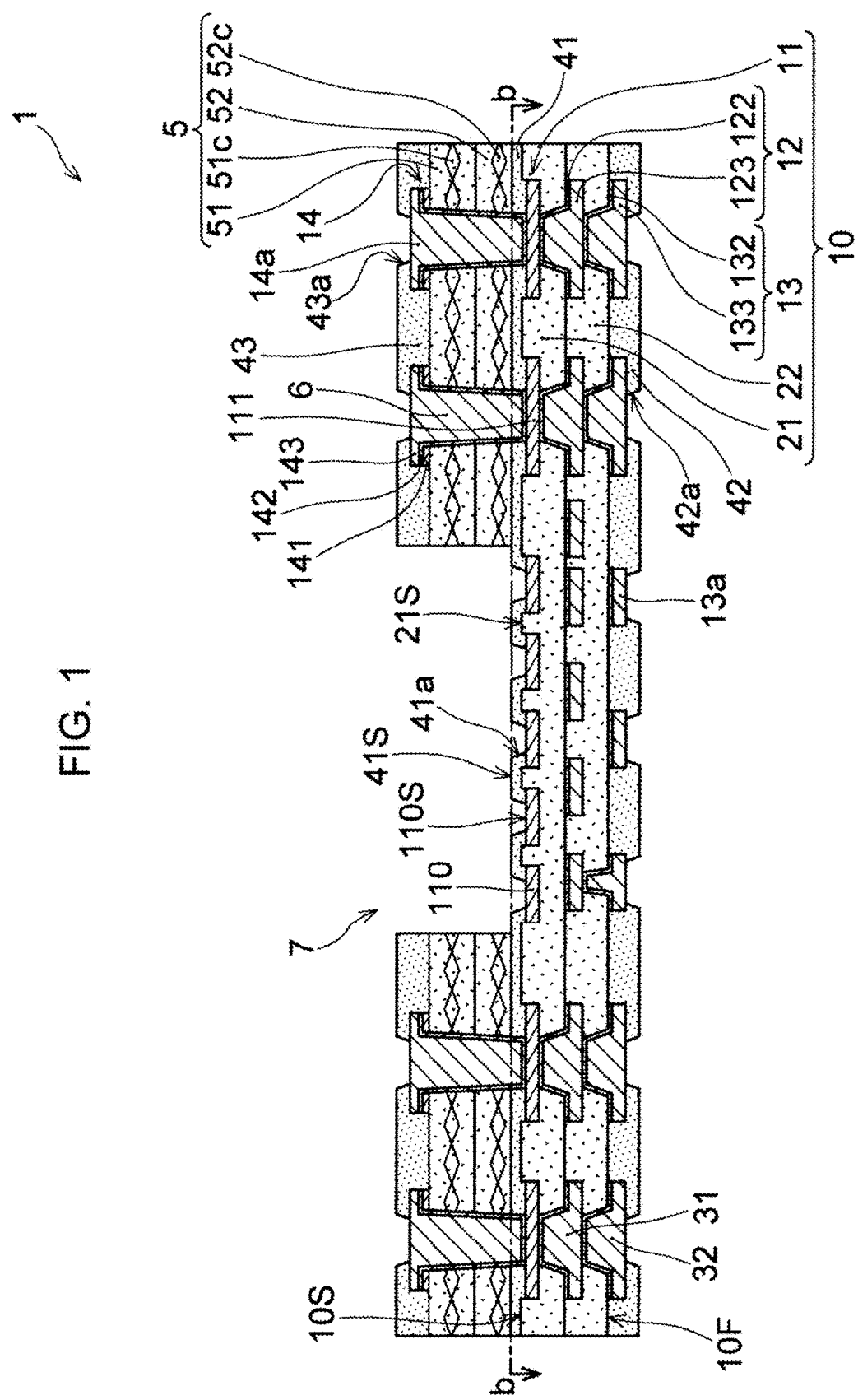
FIG. 1 is a cross-sectional view illustrating a printed wiring board according to an embodiment of the present invention.

Embodiments will now be described with reference to the accompanying drawings, wherein like reference numerals designate corresponding or identical elements throughout the various drawings.

Figure 7A:
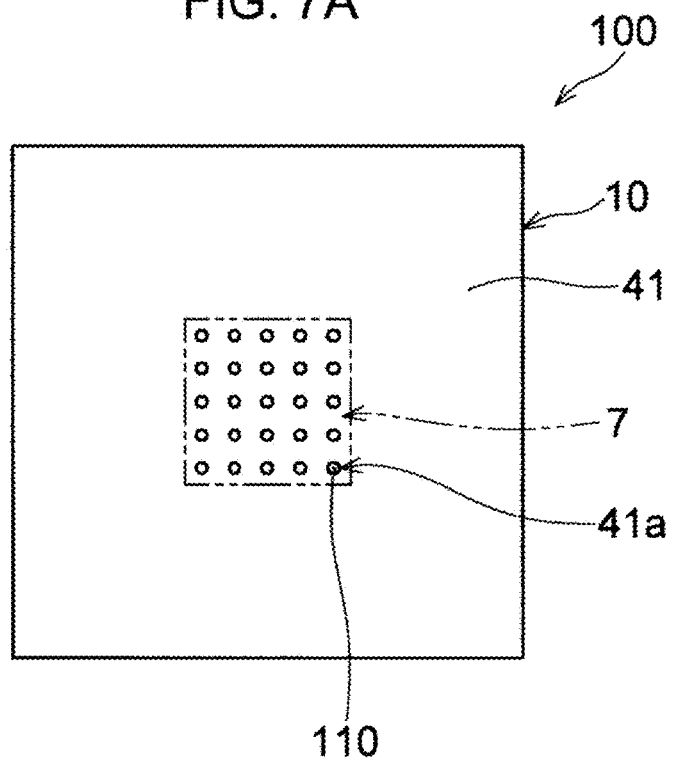
FIG. 7A is a plan view of the printed circuit board of FIG. 1 during manufacturing.
Figure 7B:
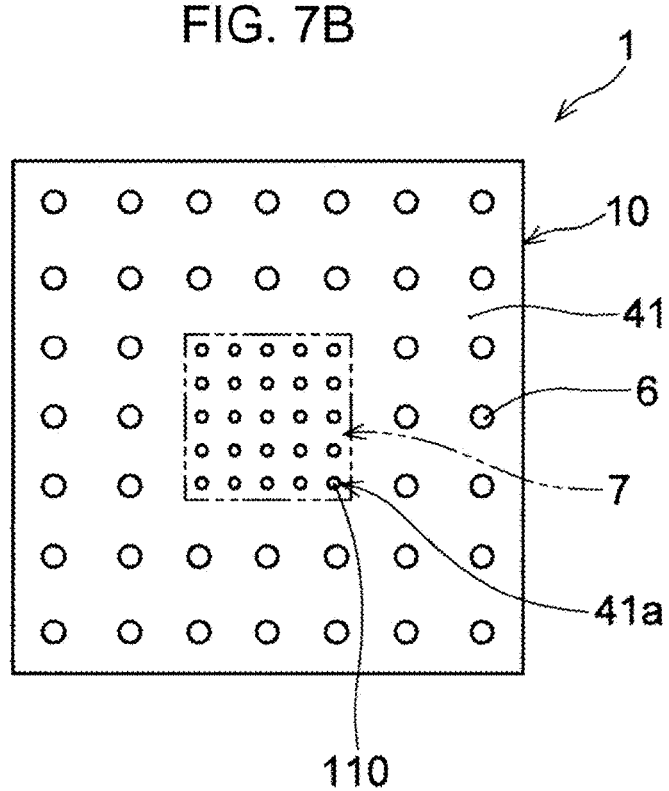
FIG. 7B is a top view of an interface of a printed wiring board according to an embodiment of the present invention, a cross-sectional view of the printed wiring board being illustrated in FIG. 1, and the interface being indicated by a b-b line in FIG. 1.
Figure 7C:
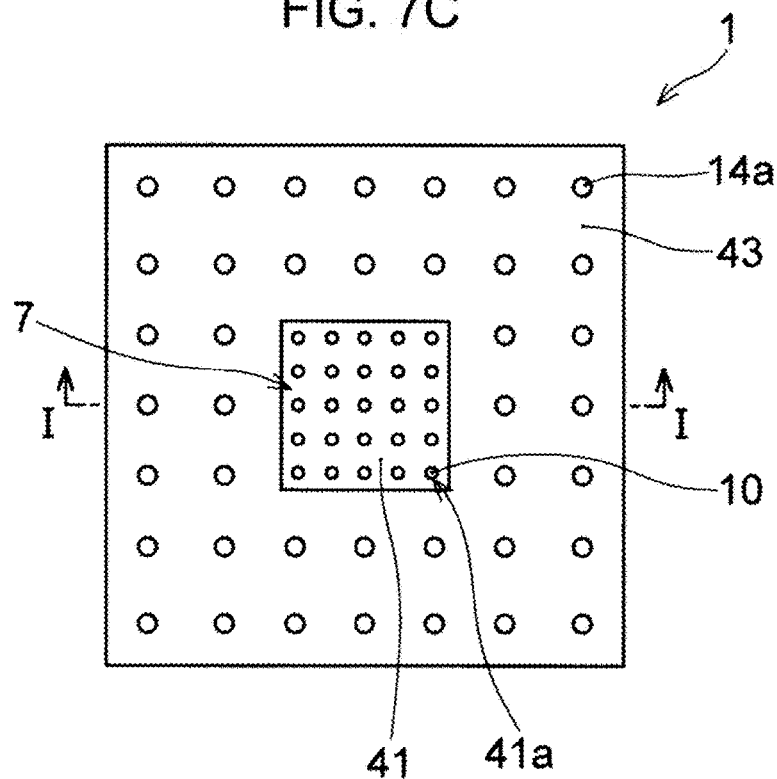
FIG. 7C is a plan view of the printed circuit board of FIG. 1.

FIG. 1 illustrates a cross-sectional view of a printed wiring board 1 (hereinafter, the printed wiring board may also be simply referred to as "the wiring board") which is an example of a printed wiring board of an embodiment. FIG. 7C illustrates a plan view of the printed wiring board 1 (FIG. 1 is a cross-sectional view at an I-I line in FIG. 7C). As illustrated in FIGS. 1 and 7C, the printed wiring board 1 includes a build-up layer 10 having a first surface (10F) and a second surface (10S) on an opposite side with respect to the first surface (10F), and a covering layer 41 formed on the second surface (10S) of the build-up layer 10. The first surface (10F) of the build-up layer 10 includes surfaces of an insulating layer (second insulating layer 22 in the example of FIG. 1) and a conductor layer (third conductor layer 13 in the example of FIG. 1) exposed on one side in a lamination direction of the build-up layer 10. Further, the second surface (10S) of the build-up layer 10 includes surfaces of an insulating layer (first insulating layer 21 in the example of FIG. 1) and a conductor layer (first conductor layer 11 in the example of FIG. 1) exposed on the other side in the lamination direction of the build-up layer 10. The printed wiring board 1 further includes a reinforcement layer 5 bonded to the second surface (10S) side of the build-up layer 10, a fourth conductor layer 14 formed on the reinforcement layer 5, and via conductors 6 penetrating the reinforcement layer 5 and the covering layer 41. The first conductor layer 11 includes one or more component mounting pads 110. One surfaces (110S) of the component mounting pads 110 are respectively exposed in openings (41a) of the covering layer 41. Then, the printed wiring board 1 has a cavity 7 that penetrates the reinforcement layer 5 and exposes the one surfaces (110S) of the component mounting pads 110. The cavity 7 exposes the one surfaces (110S) of the component mounting pads 110 on a bottom surface thereof. The covering layer 41 is formed on the first insulating layer 21 in a region where the cavity 7 is formed. An external electronic component (not illustrated in the drawings) such as a semiconductor device mounted on the printed wiring board 1 is accommodated in the cavity 7. Terminals of such an external electronic component are respectively connected to the component mounting pads 110 via bonding members such as solder bumps or directly.

The build-up layer 10 is formed by one or more insulating layers (the first insulating layer 21 and the second insulating layer 22 in the example of FIG. 1), and 2 or more conductor layers (the first conductor layer 11, the second conductor layer 12 and the third conductor layer 13 in the example of FIG. 1) laminated with the insulating layers interposed therebetween. The build-up layer 10 may contain more than three conductor layers. By allowing the build-up layer 10 to include more conductor layers, without increasing a planar size of the printed wiring board 1, a larger and more complex electrical circuit can be formed in the printed wiring board 1. The first conductor layer 11 is embedded in the first insulating layer 21 and one surface thereof is exposed on the second surface (10S) side of the build-up layer 10, that is, on the covering layer 41 side. In the present embodiment, the surface of the first conductor layer 11 facing the covering layer 41 side is recessed relative to the surface of the first insulating layer 21 facing the covering layer 41 side. Therefore, inside the cavity 7, the one surfaces (110S) of the component mounting pads 110 exposed in the cavity 7 are recessed relative to an one surface (21S) of the first insulating layer 21. in this way, when the one surfaces (110S) of the component mounting pads 110 are recessed relative to the one surface (21S) of the first insulating layer 21 surrounding the component mounting pads 110, wet spreading of bonding members such as solder bumps respectively provided on the component mounting pads 110 is suppressed. For example, the one surfaces (110S) of the component mounting pads 110 are recessed from the one surface (21S) of the first insulating layer 21 at a depth of 1 μm or more and 6 μm or less. When the one surfaces (110S) are recessed at such a depth, it is thought that an effect of effectively suppressing a short-circuit defect can be obtained. Further, as will be described later, it is thought that an excessively long time is not required when such a recess is formed by etching.

The third conductor layer 13 of the build-up layer 10 includes lower side connection pads (13a). The lower side connection pads (13a) can be used, for example, for connecting to a motherboard of an electronic device in which the printed wiring board 1 is used, a package substrate of a semiconductor device having a laminated structure, or the like. Further, the fourth conductor layer 14 includes upper side connection pads (14a) that can be used for connecting to an electronic component or an external wiring board (not illustrated in the drawings) arranged on the second surface (10S) side of the build-up layer 10. The wiring board or the electronic component connected to the upper side connection pads (14a) can be arranged on the fourth conductor layer 14, for example, in a manner straddling the cavity 7.

In the example of FIG. 1, the printed wiring board 1 further includes a solder resist layer 42 formed on the surfaces of the third conductor layer 13 and the second insulating layer 22, and a solder resist layer 43 formed on surfaces of the fourth conductor layer 14 and the reinforcement layer 5. The solder resist layers (42, 43) are each formed of, for example, a photosensitive polyimide resin or a photosensitive epoxy resin. The solder resist layer 42 has openings (42a) respectively exposing the lower side connection pads (13a), and the solder resist layer 43 has openings (43a) respectively exposing the upper side connection pads (14a).

The bottom surface of the cavity 7 includes the one surfaces (110S) of the component mounting pads 110 and an exposed surface (41S) of the covering layer 41 exposed in the cavity 7. As described above, the one surfaces (110S) of the component mounting pads 110 are recessed toward an opposite side with respect to cavity 7 side relative to the one surface (21S) of the first insulating layer 21. Further, in the present embodiment, since the covering layer 41 is formed between the component mounting pads 110, it is thought that a short-circuit defect between adjacent component mounting pads 110 or between the component mounting pads 110 and adjacent conductor patterns is prevented with a higher probability. It is thought that an electronic component or the like is connected on the component mounting pads 110 with a good quality.

The covering layer 41 is formed on the first insulating layer 21 and the first conductor layer 11, and has the openings (41a) that respectively cover peripheries of the component mounting pads 110 and expose on inner sides thereof the one surfaces (110S) of the component mounting pads 110. That is, the covering layer 41 is formed on the surface of the first conductor layer 11 forming the bottom surface of the cavity 7 excluding the one surfaces (110S) of the component mounting pads 110 exposed from the openings (41a), and on the entire surface of the first insulating layer 21 on the second surface (10S) side in a formation region of the cavity 7. Further, the covering layer 41 is also formed on an entire interface between the first conductor layer 11 and the first insulating layer 21 and the reinforcement layer 5, the interface being a surface of the build-up layer 10 on the second surface (10S) side. Therefore, in the present embodiment, the reinforcement layer 5 is bonded to the second surface (10S) side of the build-up layer 10 via the covering layer 41. Although a method for manufacturing the printed wiring board 1 will be described later, the covering layer 41 is formed on the first conductor layer 11 and the first insulating layer 21 so as to cover the entire surfaces of the first conductor layer 11 and the first insulating layer 21 on the second surface (10S) side except for the openings (41a). A printed wiring board 100 during manufacturing in this state is illustrated in FIG. 7A. FIG. 7A is a top view of the printed wiring board 1 during manufacturing after the covering layer 41 is formed on the second surface (10S) of the build-up layer 10. Here, the covering layer 41 covers the entire second surface (10S) of the build-up layer 10 on an outer side of the formation region of the cavity 7. Then, the via conductors 6 are formed so as to penetrate the covering layer 41 on the outer side of the formation region of the cavity 7 to be connected to the first conductor layer 11. FIG. 7B illustrates a top view of an interface of the printed wiring board 1, the interface being indicated by a b-b line in FIG. 1. Since the via conductors 6 are formed to penetrate the covering layer 41, as illustrated in FIG. 7B, peripheral walls of end portions of the via conductors 6 connected to the first conductor layer 11 are covered by the covering layer 41.

The covering layer 41 can be formed using any insulating resin. The material of the covering layer 41 may be the same as that of the insulating layers in the build-up layer 10. For example, the covering layer 41 can be formed by forming a photosensitive polyimide resin layer or a photosensitive epoxy resin layer on the surfaces of the first conductor layer 11 and the first insulating layer 21 of the build-up layer 10. An insulating resin or the like having the same composition as a material of the solder resist layers (42, 43) may be selected as the material of the covering layer 41. That is, the covering layer 41 may be a solder resist layer. Then, the openings (41a) that respectively cover the edge portions of the component mounting pads 110 and expose on inner sides thereof the one surfaces (110S) of the component mounting pads 110 are formed using a photolithography technology.

In the example of FIGS. 1 and 7A-7C, the cavity 7 is provided at a central portion of the printed wiring board 1 and has a quadrangular opening shape. In the present embodiment, the cavity 7 has a wall surface substantially perpendicular to the reinforcement layer 5. However, the wall surface of the cavity 7 may also be, for example, a tapered surface such that the opening shape of the cavity 7 is reduced in size toward the bottom surface of the cavity 7. When the wall surface of the cavity 7 is such a tapered surface, an opening area of the cavity 7 is larger on an opening side (the fourth insulating layer 14 side) than on the bottom surface side. Therefore, it is easy to arrange an external electronic component (not illustrated in the drawings) into the cavity 7. As will be described later, the wall surface of the cavity 7 having such a tapered shape can be formed by appropriately adjusting laser used when the cavity 7 is formed. In the cavity 7, the component mounting pads 110 arranged in a matrix of 5 rows and 5 columns and the covering layer 41 covering the first insulating layer 21 which is an outermost insulating layer of the build-up layer 10 on the cavity 7 side are exposed. As illustrated in FIGS. 1 and 7C, the upper side connection pads (14a) are arranged in 2 rows around an entire circumference of the cavity 7. The lower side connection pads (13a) (see FIG. 1) can be arranged on a lower surface on an opposite side with respect to an upper surface of the printed wiring board 1 illustrated in FIG. 7C, for example, in a matrix arrangement or in a circumferential arrangement similar to that of the upper side connection pads (14a).

Although not illustrated in the drawings, a protective film may be formed on each of exposed surfaces of the component mounting pads 110 and the upper side and lower side connection pads (14a, 13a). Such a protective film may be, for example, multiple or a single metal plating film such as Ni/Au, Ni/Pd/Au, or Sn, or may be an OSP film. The opening shape of the cavity 7 and the formation position of the cavity 7 in the printed wiring board 1, and the numbers and arrangement patterns of the component mounting pads 110 and the upper side and lower side connection pads (14a, 13a) are not limited to the example illustrated in FIGS. 1 and 7C.

The first-fourth conductor layers (11-14) can each be formed using any material having suitable conductivity such as copper or nickel. The first-fourth conductor layers (11-14) are each preferably formed by a copper foil, an electrolytic copper plating film or an electroless copper plating film or a combination thereof. In the example of FIG. 1, the first conductor layer 11 is formed by only one layer. Preferably, the first conductor layer 11 is formed by an electrolytic copper plating film. Further, the second and third conductor layers (12, 13) each have a two-layer structure formed by, in order from a side close to the first conductor layer 11, an electroless copper plating film layer (122 or 132) and an electrolytic copper plating film layer (123 or 133). The fourth conductor layer 14 has a three-layer structure and includes, in order from a side close to the first conductor layer 11, a copper foil layer 141, an electroless copper plating film layer 142, and an electrolytic copper plating film layer 143. However, the structures of the conductor layers are not limited to the single-layer structure or multilayer structures exemplified in FIG. 1.

The printed wiring board 1 may further include, on the reinforcement layer 5 and the fourth conductor layer 14, an insulating layer and a conductor layer formed on the insulating layer. It is possible that a more complicated electrical circuit can be formed in the printed wiring board 1, and a difference in the number of conductor layers and insulating layers between the build-up layer 10 side and an opposite side thereof of the reinforcement layer 5 is reduced and warpage of the printed wiring board 1 is suppressed.

As described above, the via conductors 6 penetrate the reinforcement layer 5 and the covering layer 41. The via conductors 6 electrically connect the fourth conductor layer 14 and the first conductor layer 11 to each other. In the present embodiment, as illustrated in FIG. 1, the reinforcement layer 5 in which the fourth conductor layer 14 is formed is not only bonded to the build-up layer 10 via the covering layer 41 but is also connected to the build-up layer 10 via the via conductors 6. Therefore, peeling between the respective layers is thought to be further suppressed.

The via conductors 6 each have a tapered shape that is reduced in diameter toward the first conductor layer 11. Therefore, pads (via conductor connection pads 111) provided in the first conductor layer 11 for connecting to the via conductors 6 may be small. That is, since the via conductors 6 each have such a small diameter at a surface connecting to the first conductor layer 11, it is not necessary to have an excessive space for connecting to the via conductors 6 in the first conductor layer 11 to which the via conductors 6 are connected. Further, in the present embodiment, as will be described later, the first conductor layer 11 can be formed using an additive method which is advantageous for forming a fine pitch pattern. Therefore, the via conductors 6 may be preferable as interlayer connectors connecting the first conductor layer 11 formed with a fine pitch pattern to another conductor layer. For convenience, the term "reduced in diameter" is used. However, an opening shape in which each of the via conductors 6 and other via conductors is formed is described later and is not necessarily limited to a circular shape. The term "reduced in diameter" means that a longest distance between two points on an outer circumference of a horizontal cross section of each of the via conductors 6 or other via conductors to be described later is reduced.

Via conductors 31 connecting to each other the first conductor layer 11 and the second conductor layer 12, and via conductors 32 connecting to each other the third conductor layer 13 and the second conductor layer 12 are respectively formed in the first insulating layer 21 and the second insulating layer 22 in the build-up layer 10. Then, the via conductors each have a tapered shape that is reduced in diameter toward the first conductor layer 11.

The via conductors (6, 31, 32) are preferably each formed by an electroless copper plating film and an electrolytic copper plating film. As illustrated in FIG. 1, the via conductors 6 can be integrally formed with the electroless copper plating film layer 142 and the electrolytic copper plating film layer 143 that form the fourth conductor layer 14. Similarly, the via conductors (31, 32) also can be integrally formed with the respective electroless copper plating films (122, 132) and electrolytic copper plating films (123, 133) that form the second and third conductor layers (12, 13).

The reinforcement layer 5 is formed using any insulating resin. In the example of FIG. 1, the reinforcement layer 5 is formed by bonding to each other two layers including an insulating layer 51 and an insulating layer 52. However, the structure of the reinforcement layer 5 is not limited to the two-layer structure of FIG. 1. In the example of FIG. 1, the insulating layers (51, 52) preferably respectively contain core materials (51c, 52c) each impregnated with an insulating resin. Mechanical strength of the printed wiring board 1 can be improved. Examples of materials used for the reinforcement layer 5 include a core material such as a glass fiber or an aramid fiber, and an insulating resin such as an epoxy resin impregnated in the core material. For example, the reinforcement layer 5 can be formed of a cured product of a prepreg obtained by impregnating a core material such as a glass fiber with a resin material such as an epoxy resin. When the reinforcement layer 5 is formed by multiple layers, preferably, the layers (the insulating layers (51, 52) in the example of FIG. 1) are formed of the same material. The layers can firmly adhere to each other. Therefore, it is thought that delamination in the reinforcement layer 5 or cracks at interfaces between the insulating layers forming the reinforcement layer 5 when the layers are exposed to the wall surface of the cavity 7 are unlikely to occur. Further, the insulating layers (the insulating layers (51, 52)) forming the reinforcement layer 5, and the above-described covering layer 41, may each contain an inorganic filler such as silica.

The insulating layers (the first and second insulating layers (21, 22) in the example of FIG. 1) in the build-up layer 10 can also be each formed using any insulating resin such as an epoxy resin. Further, the insulating layers may each contain an inorganic filler such as silica. However, in order to reduce a risk of occurrence of delamination between the covering layer 41 and the first insulating layer 21 when the cavity 7 is produced or when the printed wiring board 1 is used, as the material of the first insulating layer 21, a material that firmly adheres to the covering layer 41 is preferable. In the example of FIG. 1, both the first and second insulating layers (21, 22) are formed using an epoxy resin containing a silica filler and do not contain a core material. When the insulating layers in the build-up layer 10 are formed using the same material, it is possible that delamination between the insulating layers is prevented.

Figure 2:
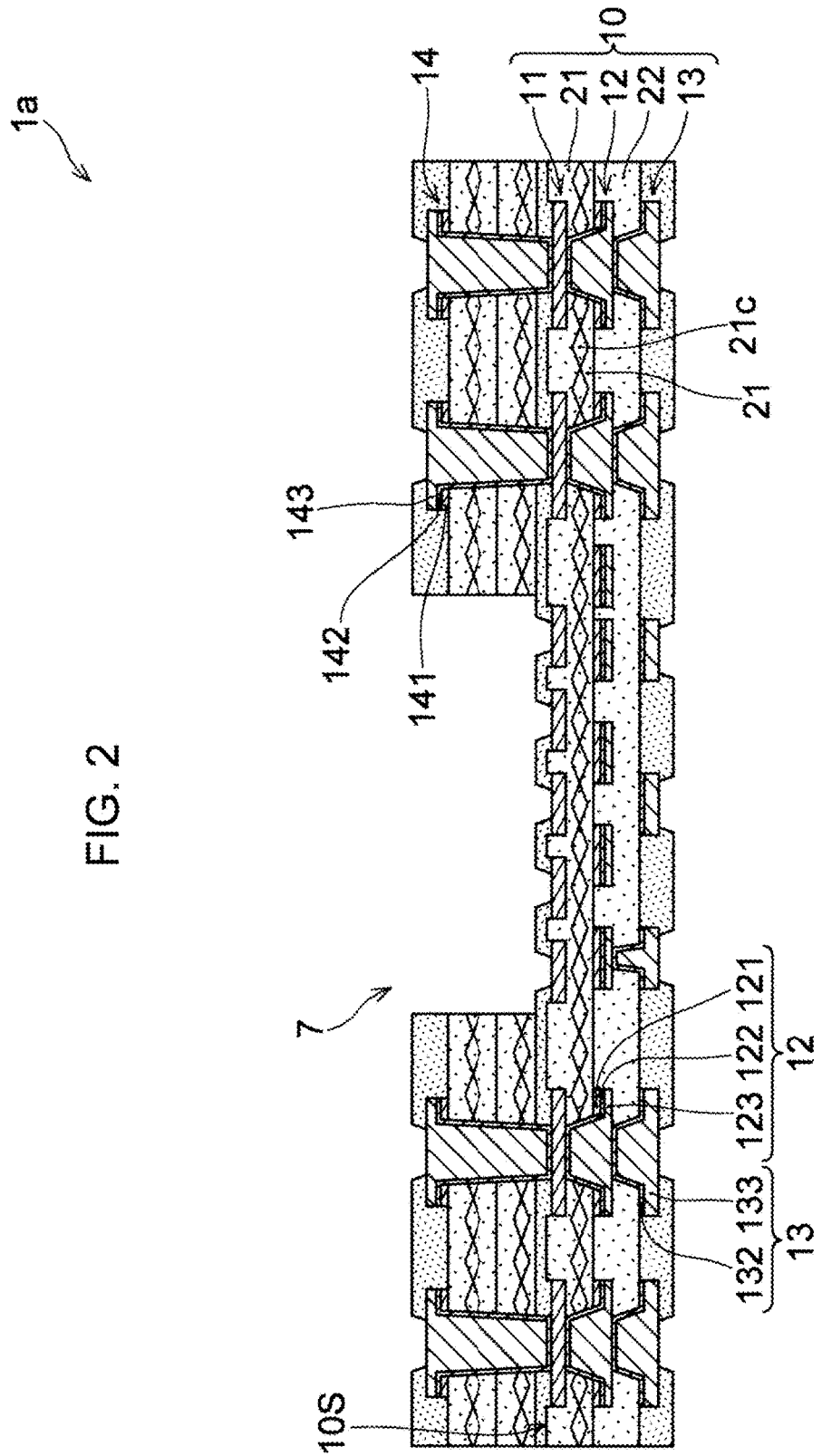
FIG. 2 is a cross-sectional view illustrating a printed wiring board according to another embodiment of the present invention.

When necessary, the insulating layers forming the build-up layer 10 may contain a core material such as a glass fiber or an aramid fiber. By including a core material in the insulating layers, it is possible that the mechanical strength of the printed wiring board 1 is further improved. This example is illustrated in FIG. 2. In a printed wiring board (1a) illustrated in FIG. 2, the second insulating layer 22 is formed using an epoxy resin containing a silica filler and does not contain a core material, similar to that in the example of FIG. 1. The first insulating layer 21 which is the outermost insulating layer on the second surface (10S) side (the cavity 7 side) of the build-up layer 10 is formed using an epoxy resin containing a silica filler and contains a core material (21c). When the outermost insulating layer on the second surface (10S) side contains a core material, it is thought that, even when a stress concentrates on a corner part of the bottom surface of the cavity 7, a crack or the like is unlikely to occur. As illustrated in FIG. 2, among the first-fourth conductor layers (11-14) of the printed wiring board (1a), the first conductor layer 11, the third conductor layer 13 and the fourth conductor layer 14 are respectively formed to have an one-layer structure, a two-layer structure and a three-layer structure, similar to those in the printed wiring board 1. On the other hand, the second conductor layer 12 has a three-layer structure and includes, in order from the side close to the first conductor layer 11, a copper foil layer 121, an electroless copper plating film layer 122, and an electrolytic copper plating film layer 123. In FIG. 2 and FIG. 3-6 to be described later, a structural element that is the same as a main structural element illustrated in FIG. 1 is indicated using the same reference numeral symbol as in FIG. 1 or the reference numeral symbol is omitted, and a further description thereof is also omitted.

As described above, a protective film may be formed on each of the exposed surfaces of the component mounting pads 110 and the upper side and lower side connection pads (14a, 13a). In a printed wiring board (1b) of FIG. 3, protective films 61 are respectively formed on the exposed surfaces of the component mounting pads 110 and the upper side connection pads (14a). Then, bonding members 62 formed of solder are respectively provided on the protective films 61. The printed wiring board (1b) excluding the protective films 61 and the bonding members 62 is the same as the example of the printed wiring board 1 illustrated in FIG. 1. The covering layer 41 is formed on the bottom surface of the cavity 7. A depth from the exposed surface (41S) of the covering layer 41 exposed in the cavity 7 to the one surfaces (110S) of the component mounting pads 110 is larger than a depth from the one surface (21S) of the first insulating layer 21 to the one surfaces (110S) of the component mounting pads 110. Therefore, even when the bonding members 62 are respectively formed on the component mounting pads 110 which are formed at a fine pitch, the material of the bonding members 62 fits in recesses from the exposed surface (41S) of the covering layer 41 without overflowing from the recesses. A short-circuit defect between adjacent component mounting pads 110 is unlikely to occur.

Figure 4:
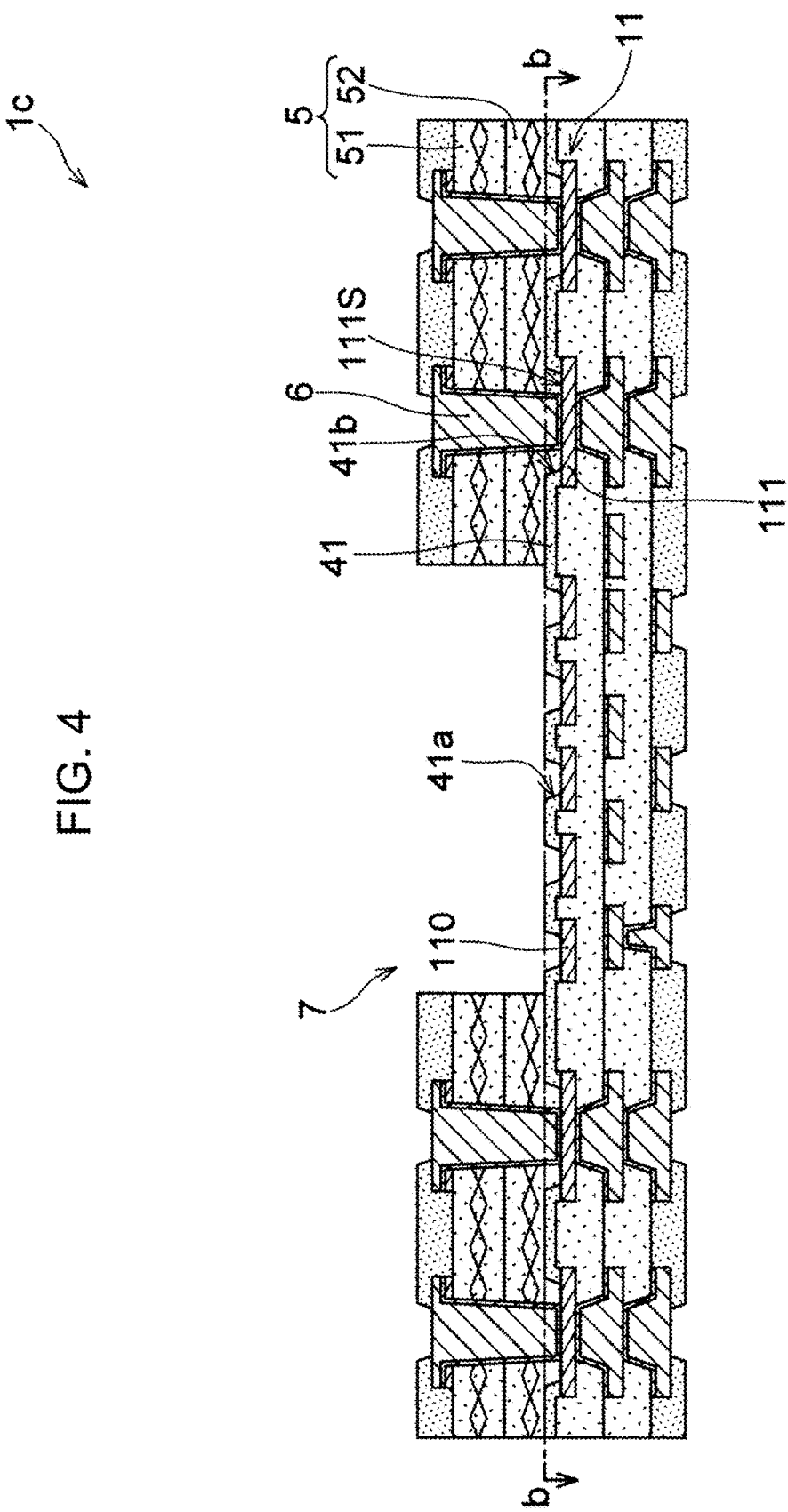
FIG. 4 is a cross-sectional view illustrating a printed wiring board according to another embodiment of the present invention.
Figure 8:
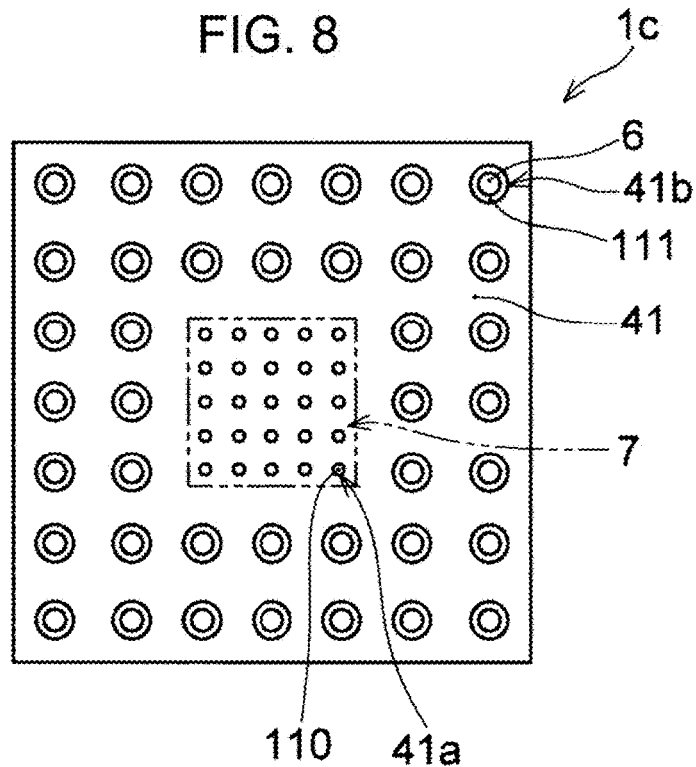
FIG. 8 is a top view of an interface of a printed wiring board according to an embodiment of the present invention, a cross-sectional view of the printed wiring board being illustrated in FIG. 4, and the interface being indicated by a b-b line in FIG. 4.

The end portions of the via conductors 6 connected to the first conductor layer 11 may not be covered by the covering layer 41 as in the example of FIG. 1. A cross-sectional view of a printed wiring board (1c) of such an example is illustrated in FIG. 4. The covering layer 41 of the printed wiring board (1c) has openings (41b) respectively exposing the via conductor connection pads 111 of the first conductor layer 11 on the outer side of the formation region of the cavity 7. That is, one surfaces (111S) of the via conductor connection pads 111 are respectively exposed from the openings (41b), and the via conductors 6 are respectively connected on the exposed one surfaces (111S). The via conductors 6 penetrate the reinforcement layer 5, but do not penetrate the covering layer 41. FIG. 8 illustrates a top view of an interface of the printed wiring board (1c), the interface being indicated by a b-b line in FIG. 4. As illustrated in FIG. 8, in connecting parts between the via conductors 6 and the first conductor layer 11, the covering layer 41 is formed apart from the via conductors 6. In the formation region of the cavity 7, similar to the printed wiring board 1 illustrated in FIG. 1, the covering layer 41 covers the edge portions of the component mounting pads 110 of the first conductor layer 11 exposed at the bottom of the cavity 7. Similar to the example of FIG. 1, since the covering layer 41 is formed between the component mounting pads 110, a short-circuit defect between the component mounting pads 110 is prevented.

Figure 5:
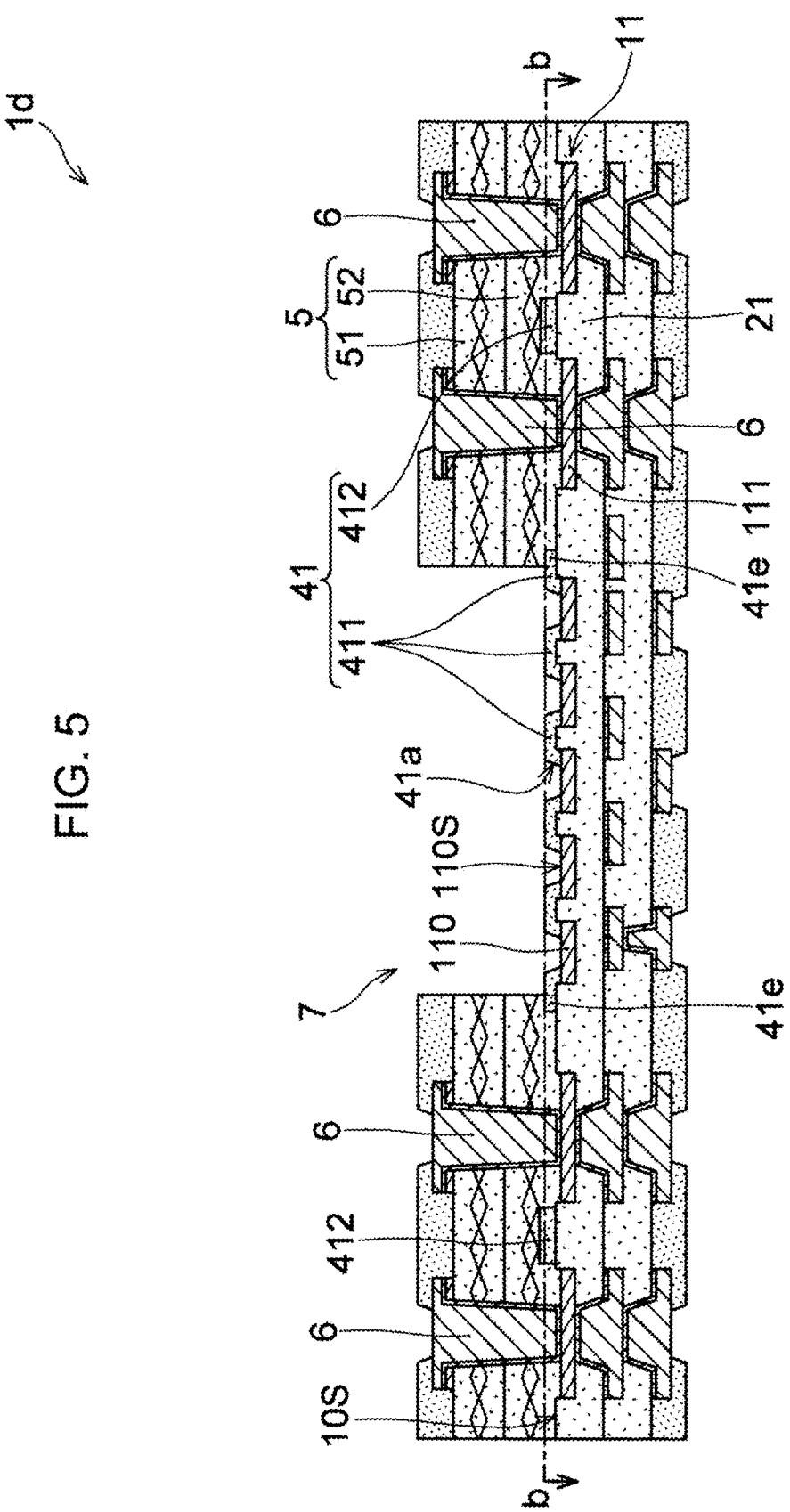
FIG. 5 is a cross-sectional view illustrating a printed wiring board according to another embodiment of the present invention.
Figure 6:
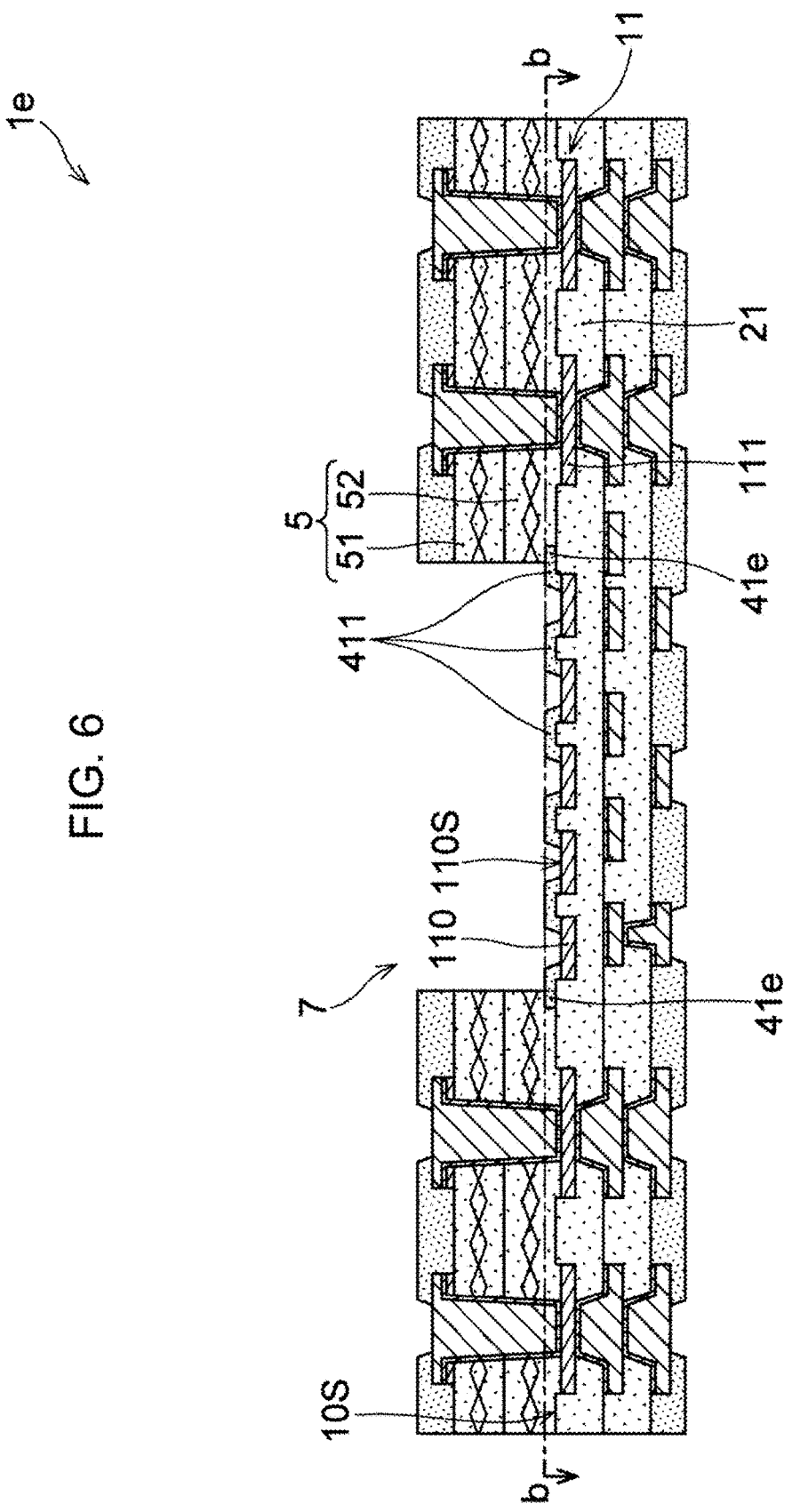
FIG. 6 is a cross-sectional view illustrating a printed wiring board according to another embodiment of the present invention.

FIGS. 5 and 6 illustrate still other examples of the printed wiring board 1. Printed wiring boards (1d, 1e) respectively illustrated in FIGS. 5 and 6 are the same as the example of the printed wiring board (1c) illustrated in FIG. 4 except for the formation position of the covering layer 41. The covering layers 41 respectively provided in the printed wiring boards (1d, 1e) both have, in the bottom surface of the cavity 7, a first covering part 411 that, similar to the examples of FIGS. 1 and 2, covers the peripheral edge portions of the one surfaces (110S) of the component mounting pads 110 and the surface of the first insulating layer 21. However, different from the printed wiring boards (1, 1a, 1b, 1c) of FIG. 1-4, the first covering part 411 of each of the printed wiring boards (1d, 1e) is separately provided. The first covering part 411 of each of the printed wiring boards (1d, 1e) has a shape larger than the formation region of the cavity 7, that is, the first covering part 411 is formed to penetrate the wall surface of the cavity 7 from the inside of the cavity 7 and extend on the first insulating layer 21 and/or the first conductor layer 11 toward an peripheral edge portion of the printed wiring board. In other words, the first covering part 411 of each of the printed wiring boards (1d, 1e) has a protruding portion (41e) on an outer periphery thereof, the protruding portion (41e) being formed so as to be sandwiched between the reinforcement layer 5 and the first insulating layer 21 and/or the first conductor layer 11 on the outer side of the formation region of the cavity 7. The protruding portion (41e) extending to the outer side of the formation region of the cavity 7 has a length from the wall surface of the cavity 7 of, for example, about 50-200 μm. When the protruding portion (41e) has such a length, the entire protruding portion (41e) included in the outer periphery of the first covering part 411 is surely sandwiched between the reinforcement layer 5 and the first insulating layer 21 and/or the first conductor layer 11. Due to the protruding portion (41e), adhesion of the covering layer 41 to the second surface (10S) of the build-up layer 10 is strong. The covering layer 41 is less likely to peel off from the wall surface and the bottom surface of the cavity 7 in the cavity 7 during manufacture or use of the printed wiring board (1d).

The covering layer 41 of the printed wiring board (1d) illustrated in FIG. 5 does not include the openings (41b) (see FIG. 4) exposing the via conductor connection pads 111 of the first conductor layer 11. The covering layer 41 of the printed wiring board (1d) has second covering parts 412 formed apart from the first covering part 411 on the outer side of the formation region of the cavity 7. The second covering parts 412 are formed in a pattern of an arbitrary shape between the multiple via conductors 6. The second covering parts 412 may be provided at arbitrary positions on the outer side of the formation region of the cavity 7. Further, the second covering parts 412 may be formed to each have a thickness different from a thickness of the first covering part 411 (a length in a lamination direction of the printed wiring board (1d)). FIG. 5 illustrates an example of the covering layer 41 having the second covering parts 412 each formed to have a larger thickness than the first covering part 411.

Figure 9:
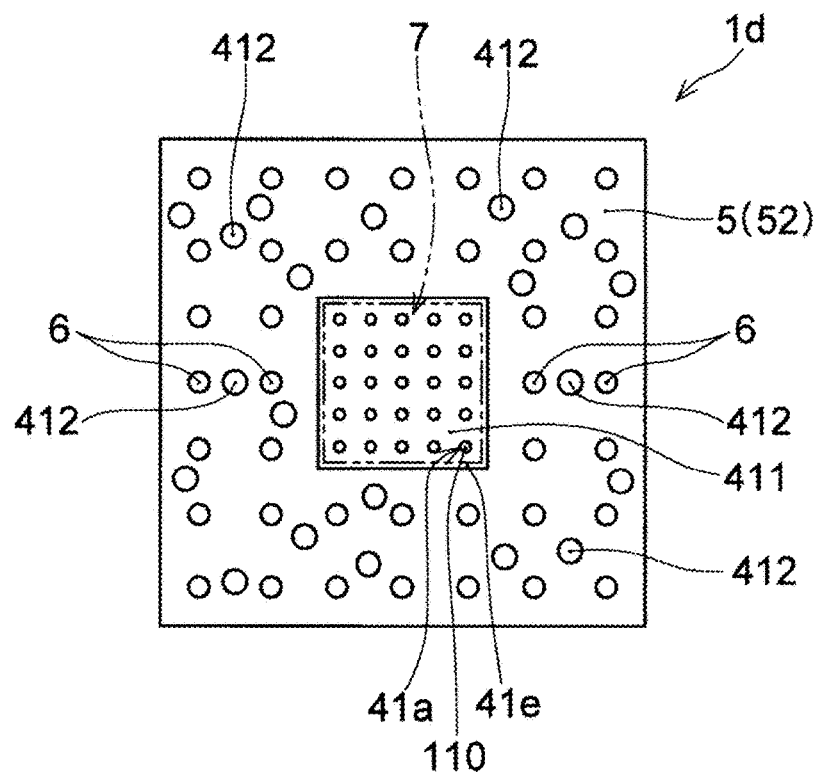
FIG. 9 is a top view of an interface of a printed wiring board according to an embodiment of the present invention, a cross-sectional view of the printed wiring board being illustrated in FIG. 5, and the interface being indicated by a b-b line in FIG. 5.

FIG. 9 illustrates a top view of an interface of the printed wiring board (1d), the interface being indicated by a b-b line in FIG. 5. As illustrated in FIG. 9, the protruding portion (41e) of the first covering part 411 of the covering layer 41 is formed on a peripheral edge of the formation region of the cavity 7, and surrounds the cavity 7 along the opening of the cavity 7. The multiple second covering parts 412 are formed on the outer side of the formation region of the cavity 7. The first covering part 411 is formed apart from the second covering parts 412. The second covering parts 412 are respectively formed at arbitrary positions independent of the formation positions of the via conductors 6. In FIG. 9, the second covering parts 412 formed on the outer side of the formation region of the cavity 7 each have a circular shape. However, the shape of each of the second covering parts 412 is not limited to a circular shape. The second covering parts 412 can each be formed in any shape. Further, when the covering layer 41 includes the multiple second covering parts 412, the second covering parts 412 may be formed to have mutually different shapes, sizes and thicknesses. In FIG. 9, for illustration purposes, an example is illustrated in which the via conductors 6 are arranged in a matrix of 2 rows and 2 columns and the multiple circular second covering parts 412 are randomly arranged.

Figure 10:
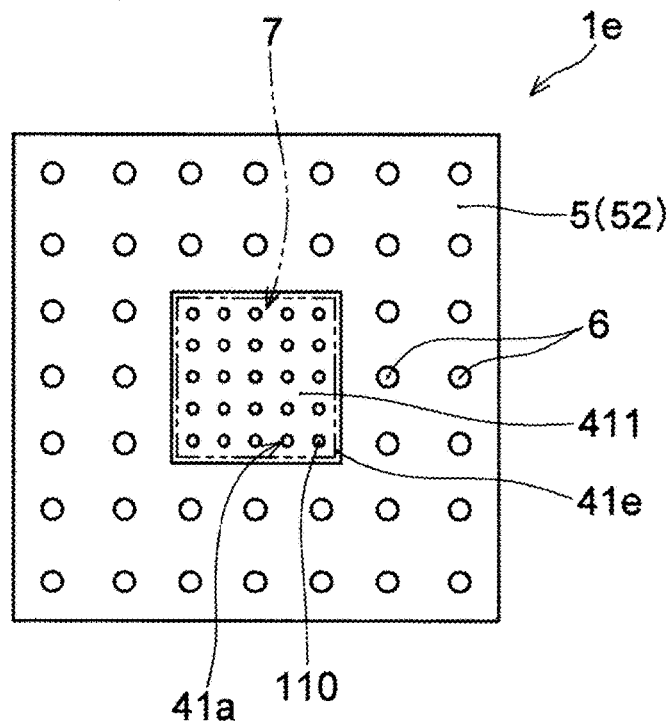
FIG. 10 is a top view of an interface of a printed wiring board according to an embodiment of the present invention, a cross-sectional view of the printed wiring board being illustrated in FIG. 6, and the interface being indicated by a b-b line in FIG. 6.

On the other hand, the covering layer 41 of the printed wiring board (1e) illustrated in FIG. 6 includes the first covering part 411 including the protruding portion (41e), but does not have the second covering parts 412. As illustrated in FIG. 10 which is a top view of an interface of the printed wiring board (1e), the interface being indicated by a b-b line in FIG. 6, different from the printed wiring board (1c) of FIG. 4 and the printed wiring board (1d) of FIG. 5, the printed wiring board (1e) does not include, on the outer side of the formation region of the cavity 7, the covering layer 41 in which the openings (41b) respectively exposing the via conductor connection pads 111 are formed, the second covering parts 412, and the like.

Next, a method for manufacturing the printed wiring board of the one embodiment having the cavity is described with reference to FIG. 11A-11L using the printed wiring board 1 illustrated in FIG. 1 as an example.

Figure 11A:
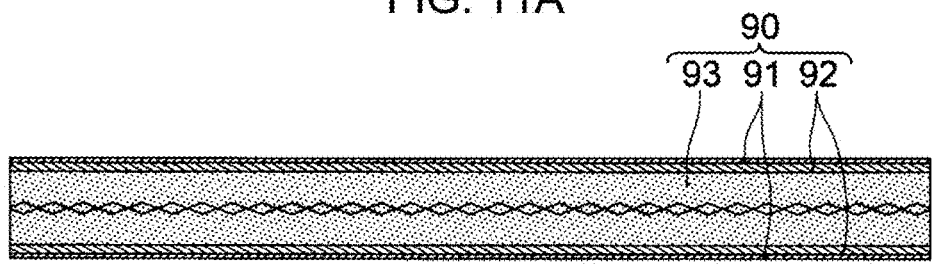
FIG. 11A-11L illustrate a method for manufacturing a printed wiring board according to an embodiment of the present invention.
Figure 11B:
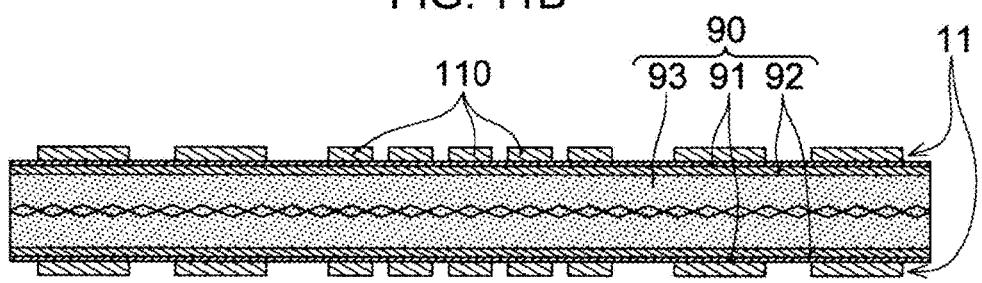
Figure 11C:
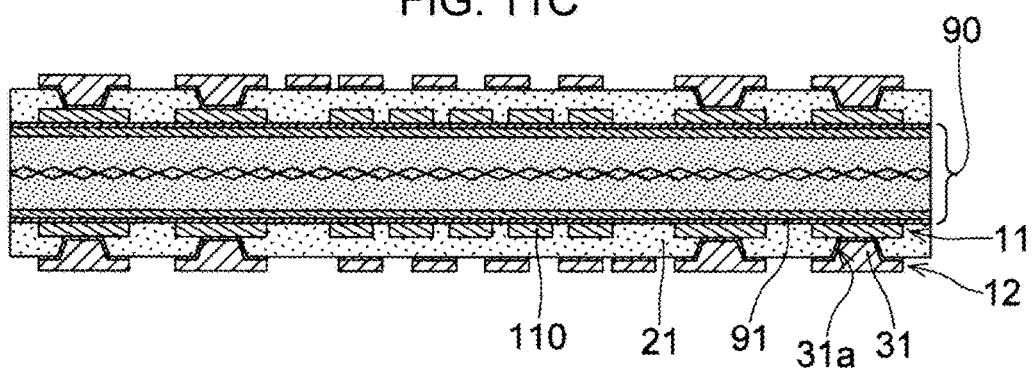
Figure 11D:
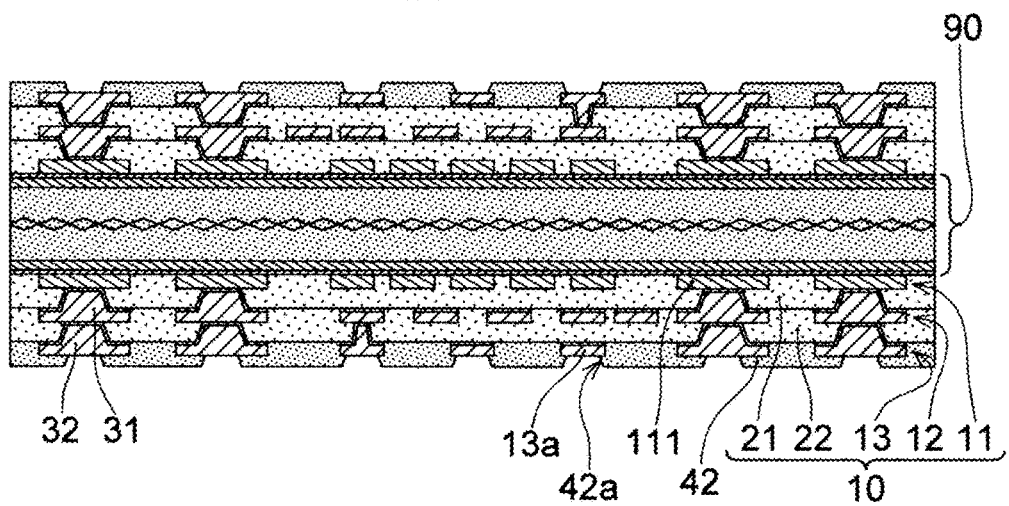
Figure 11E:
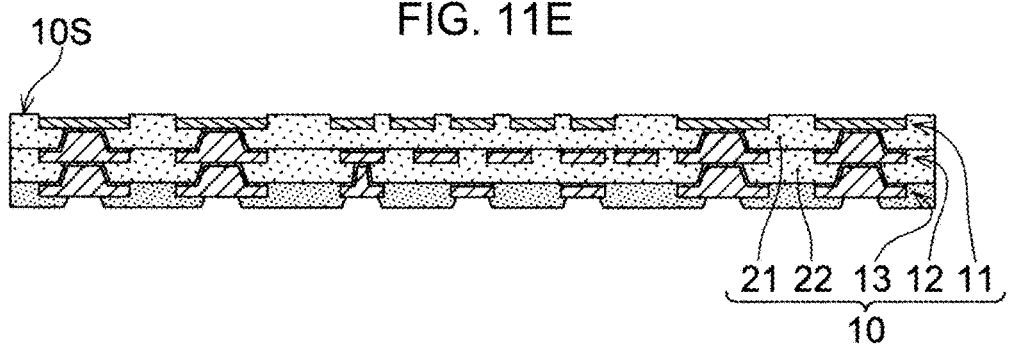
Figure 11F:
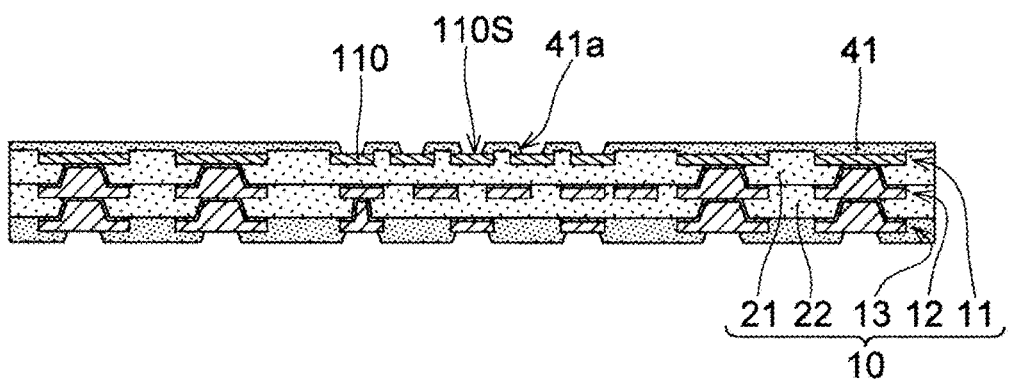
Figure 11G:
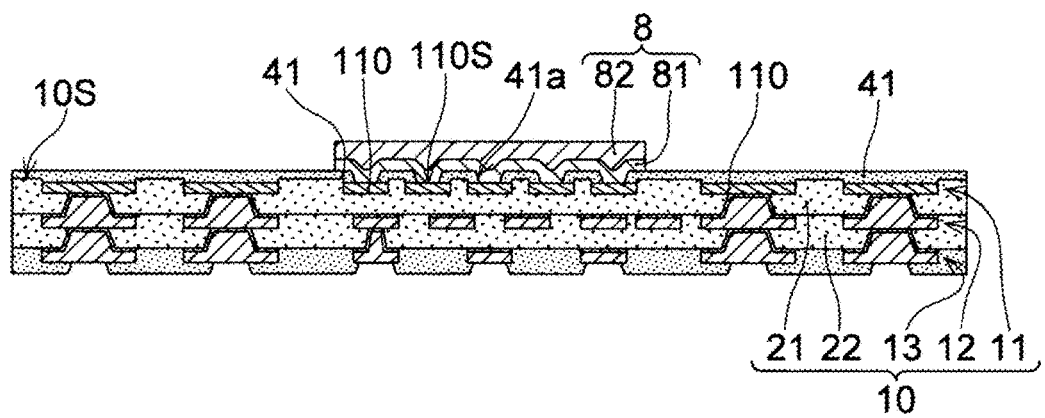
Figure 11H:
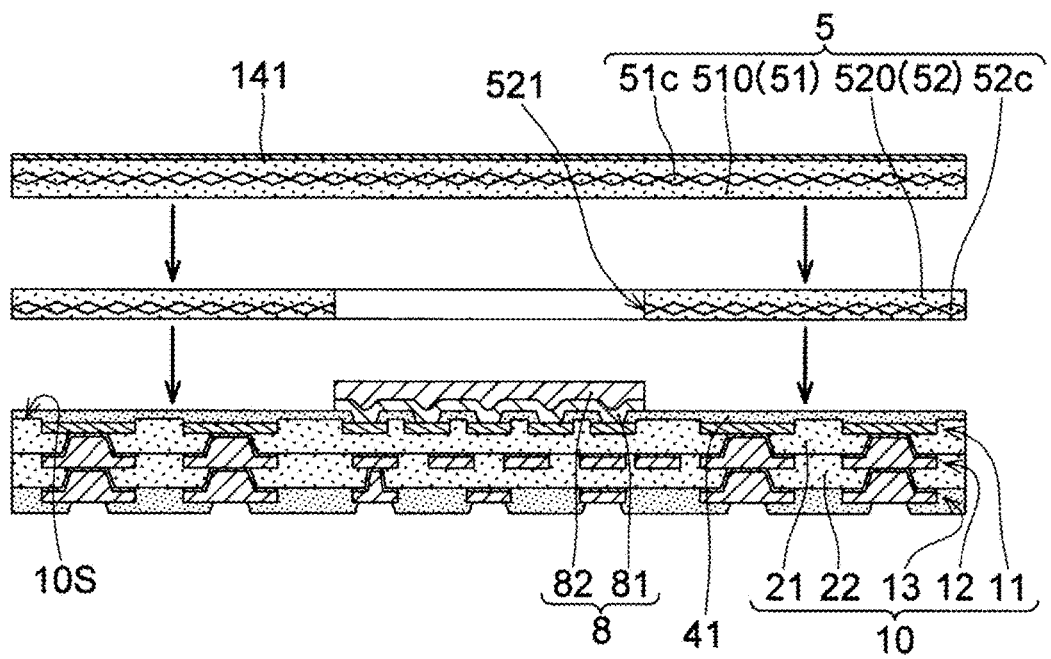
Figure 11I:
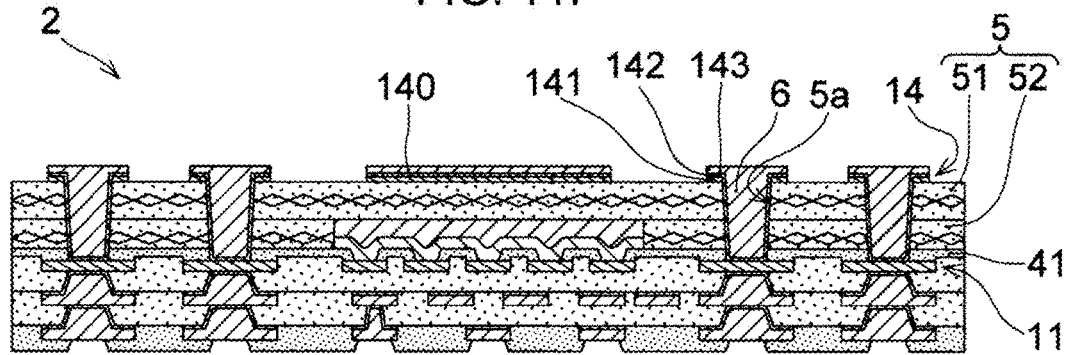
Figure 11J:
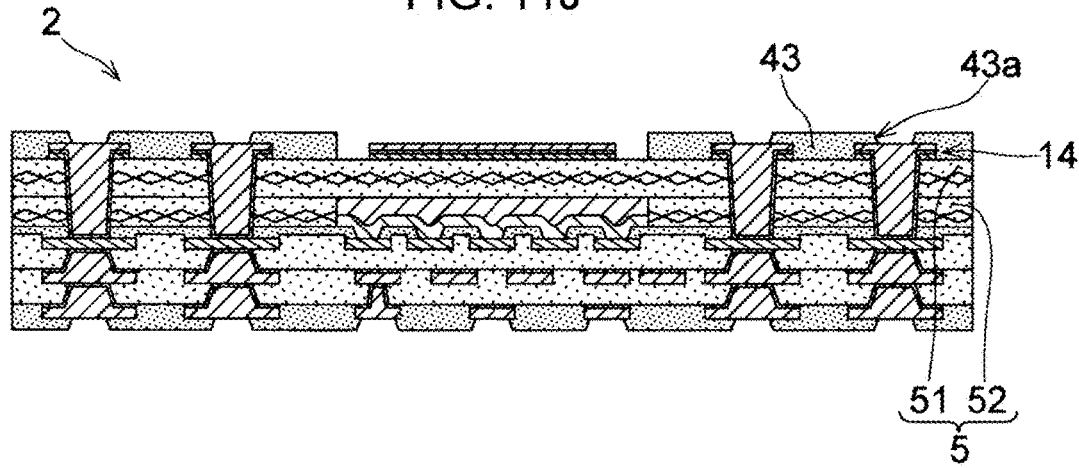

The method for manufacturing the printed wiring board of the present embodiment includes preparing a laminate 2 of conductor layers and insulating layers (see FIG. 11J). Further, the method for manufacturing the printed wiring board of the present embodiment includes forming a groove 71 penetrating the reinforcement layer 5 along a peripheral edge of a release film 8 included in the laminate 2 over an entire circumference of the release film 8 (see FIG. 11K), and forming the cavity 7 by removing a portion of the reinforcement layer 5 surrounded by the groove 71 together with the release film 8 (see FIG. 11L). First, a method for forming the laminate 2 is described.

First, as illustrated in FIGS. 11A and 11B, the first conductor layer 11 including the component mounting pads 110 is formed on a base plate 90. As illustrated in FIG. 11A, the base plate 90 having a core material 93 and a metal foil 91 on a surface of the core material 93 is prepared. The metal foil 91 has a carrier metal foil 92 adhered to one surface of the metal foil 91, and the carrier metal foil 92 and the core material 90 are bonded to each other by thermocompression bonding or the like. The metal foil 91 and the carrier metal foil 92 are adhered to each other by, for example, a separable adhesive such as a thermoplastic adhesive, or are fixed to each other only at edges thereof. For the core material 93, for example, a glass epoxy substrate is used. It is also possible that a double-sided copper-clad laminated plate is used as the core material 90 having the carrier metal foil 92. The metal foil 91 and the carrier metal foil 92 are preferably copper foils. In FIG. 11A-11L, it is not intended to illustrate exact ratios of thicknesses of the structural elements.

As illustrated in FIG. 11B, the first conductor layer 11 is formed on the base plate 90. For example, a plating resist (not illustrated in the drawings) is formed on the metal foil 91. The plating resist is provided with openings corresponding to the conductor patterns such as the component mounting pads 110 to be formed in the first conductor layer 11. Then, an electrolytic copper plating film is formed in the openings of the plating resist by electrolytic plating using the metal foil 91 as a seed layer, and thereafter, the plating resist is removed. As a result, the first conductor layer 11 including the desired conductor patterns such as the component mounting pads 110 is formed. Since etching is not used, the conductor patterns such as the component mounting pads 110 can be formed at a fine pitch. It is also possible that the first conductor layer 11 is formed using other methods such as electroless plating. It is also possible that, different from the FIG. 11B-11D, only one side of the base plate 90 is used for the formation of the first conductor layer 11 and the like. In FIGS. 11C and 11D, the reference numeral symbols for the structural elements on the upper side of the base plate 90 are omitted as appropriate on each of the drawings.

As illustrated in FIG. 11C-11E, insulating layers and conductor layers are laminated on the base plate 90 and on the first conductor layer 11, and as a result, the build-up layer 10 including the insulating layer (the first insulating layer 21) covering the first conductor layer 11 is formed. Thereafter, the base plate 90 is removed. As illustrated in FIG. 11C, the first insulating layer 21 is formed, for example, by thermocompression bonding a film-like epoxy resin or the like on exposed portions of the first conductor layer 11 and the metal foil 91. A metal foil forming a portion of the second conductor layer 12 formed in the next process may be laminated on the first insulating layer 21. The first insulating layer 21 is formed so as to cover the first conductor layer 11 including the component mounting pads 110 except for a surface thereof on the metal foil 91 side. Thereafter, conduction holes (31a) are formed, for example, by irradiating CO2 laser to the first insulating layer 21 at positions corresponding to formation locations of the via conductors 31. Then, a metal film is formed in the conduction holes (31a) and on the surface of the first insulating layer 21 (or the metal foil laminated thereon) by electroless copper plating. Further, using the metal film as a seed layer, an electrolytic plating film composed of copper or the like is formed using a pattern plating method. Thereafter, a resist used for pattern plating is removed, and the metal film (and the metal foil) exposed by the removal of the resist is removed. As a result, the second conductor layer 12 including the desired conductor patterns is formed. Further, the via conductors 31 are respectively formed in the conduction holes (31a).

As illustrated in FIG. 11D, the second insulating layer 22, the third conductor layer 13 and the via conductors 32 are respectively formed using the same methods as the methods for forming the first insulating layer 21, the second conductor layer 12 and the via conductors 31. As a result, the build-up layer 10 is formed on the base plate 90. Next, the solder resist layer 42 is formed by forming a photosensitive epoxy resin or polyimide resin layer on the surfaces of the third conductor layer 13 and the second insulating layer 22. Then, the openings (42a) respectively exposing the lower side connection pads (13a) are formed using a photolithography technology.

Thereafter, the base plate 90 is removed. Specifically, the carrier metal foil 92 and the metal foil 91 are separated from each other, and the metal foil 91 exposed by the separation is removed, for example, by etching. The separation of the metal foil 91 and the carrier metal foil 92 can be performed, for example, by softening, by heating, the thermoplastic adhesive that adheres the two to each other, or by cutting off a joining portion where the two are fixed to each other at the edges thereof. By removing the base plate 90, the first conductor layer 11 and the first insulating layer 21 are exposed. The metal foil 91 is removed by etching. However, even after the metal foil 91 has disappeared, the etching is continued such that the individual conductor patterns in the first conductor layer 11 are reliably separated from each other. As a result, as illustrated in FIG. 11E, the exposed surface of the first conductor layer 11 exposed after the metal foil 91 disappears is recessed relative to the exposed surface of the first insulating layer 21 by being etched. In the second surface (10S) of the build-up layer 10, the first insulating layer 21, and the first conductor layer 11 recessed relative to the first insulating layer 21, are formed.

As illustrated in FIG. 11F, the covering layer 41 is provided on the exposed surfaces of the first insulating layer 21 and the first conductor layer 11. For example, a photosensitive epoxy resin or polyimide resin layer is formed on the surfaces of the first conductor layer 11 and the first insulating layer 21. Then, the openings (41a) that respectively cover the edge portions of the component mounting pads 110 and expose the one surfaces (110S) of the component mounting pads 110 are formed using a photolithography technology.

When the above-described printed wiring board (1c) illustrated in FIG. 4 is manufactured, the covering layer 41 is formed to include the openings (41a) and the openings (41b) exposing the via conductor connection pads 111 (see FIG. 4). Further, when the printed wiring boards (1d, 1e) respectively illustrated in FIGS. 5 and 6 are each manufactured, the first covering part 411 including the openings (41a) is formed from a photosensitive epoxy resin or polyimide resin layer similarly formed on the surfaces of the first conductor layer 11 and the first insulating layer 21 using a photolithography technology. As described above, the first covering part 411 is formed to be larger than the formation region of the cavity 7 by the protruding portion (41e). In the printed wiring board (1d), in addition to the first covering part 411, the multiple second covering parts 412 are formed. The second covering parts 412 are formed at the same time as the first covering part 411. However, it is also possible that the second covering parts 412 and the first covering part 411 are separately formed.

Next, the release film 8 is provided in the formation region of the cavity 7 on the second surface (10S) side of the build-up layer 10. The release film 8 is provided using at least a material that does not firmly adhere to but can be in close contact with the first conductor layer 11 and the covering layer 41. That is, penetration of a constituent material of a prepreg 520 (see FIG. 11H) or the like into an interface between the release film 8 and the first conductor layer 11 and the covering layer 41 is prevented by the adhesion of the release film 8. However, the release film 8 can be easily separated from the first conductor layer 11 and the covering layer 41 with a relatively weak force. As will be described later, in a later process, the reinforcement layer 5 (see FIG. 11H) is laminated on the covering layer 41 provided on the build-up layer 10 via the release film 8, and thereafter, a portion of the reinforcement layer 5 in the formation region of the cavity 7 (see FIG. 11L) is removed. The release film 8 allows the portion of the reinforcement layer 5 to be easily peeled off.

In the example of FIG. 11G, the release film 8 has an adhesive layer 81 on the build-up layer 10 side and a bonding layer 82 laminated on the adhesive layer 81. As described above, the adhesive layer 81 is formed of a material that does not firmly adhere to but can be in close contact with to the first conductor layer 11 and the covering layer 41. For the adhesive layer 81, for example, an acrylic resin is used. On the other hand, the bonding layer 82 is formed of a material capable of exhibiting sufficient adhesion with respect to the insulating layer 52 forming the reinforcement layer 5. For the bonding layer 82, for example, a polyimide resin is used.

For example, the adhesive layer 81 and the bonding layer 82 are provided on the entire surfaces of the first conductor layer 11 and the covering layer 41 on the second surface (10S) side. Thereafter, by removing portions of the adhesive layer 81 and the bonding layer 82 on the outer side of the formation region of the cavity 7, the release film 8 having a planar shape based on the opening shape of the cavity 7 can be formed.

Alternatively, it is also possible that the release film 8 formed in advance into a shape based on the opening shape of the cavity 7 is placed on the surfaces of the first conductor layer 11 and the covering layer 41 on the second surface (10S) side corresponding to the formation region of the cavity 7. In the present embodiment, except for the one surfaces (110S) of the component mounting pads 110 exposed from the openings (41a), the entire second surface (10S) of the build-up layer 10 is covered by the covering layer 41. Therefore, the surface of the first conductor layer 11 excluding the one surfaces (110S) of the component mounting pads 110 exposed on the second surface (10S) side is not in contact with the adhesive layer 81. Therefore, even when the adhesive layer 81 and the bonding layer 82 are provided on the entire surface on the second surface (10S) side, and thereafter, the portions of the adhesive layer 81 and the bonding layer 82 on the outer side of the formation region of the cavity 7 are removed, there is no risk that residues or the like of the adhesive layer 81 adhered on the first conductor layer 11 remain thereon. A connection failure on the via conductor connection pads 111 of the first conductor layer 11 can be prevented. On the other hand, in the formation region of the cavity 7, the recesses are formed by the covering layer 41, the openings (41a) of the covering layer 41 and the one surfaces (110S) of the component mounting pads 110 exposed from the openings (41a). As illustrated in FIG. 11G, a portion of the adhesive layer 81 can enter into the recesses. As a result, penetration of the prepreg 520 (see FIG. 11H) into the interface between the release film 8 and the first conductor layer 11 can be more reliably prevented.

However, since the covering layer 41 is formed on the first insulating layer 21, as compared to a case where the covering layer 41 is not formed, a depth from the surface on the second surface (10S) side to the one surfaces (110S) of the component mounting pads 110 is increased. Therefore, although a portion of the adhesive layer 81 can enter into the recesses, the covering layer 41 functions as a spacer, and the adhesive layer 81 entered into the recesses does not firmly adhere to bottom surfaces of the recesses, that is, the one surfaces (110S) of the component mounting pads 110 and wall surfaces. As a result, when the adhesive layer 81 and the bonding layer 82 are removed together with a portion of the reinforcement layer 5 when the cavity 7 is formed by peeling off the portion of the reinforcement layer 5 (see FIG. 11L). The adhesive layer 81 easily and satisfactorily peels off from the one surfaces (110S) of the component mounting pads 110. Residues or the like of the adhered adhesive layer 81 do not remain on the one surfaces (110S) of the component mounting pads 110. By peeling off the portion of the reinforcement layer 5, clean one surfaces (110S) of the component mounting pads 110 are exposed in the cavity 7. A connection failure on the component mounting pads 110 is unlikely to occur.

In the case of the printed wiring board (1c) illustrated in FIG. 4, the covering layer 41 has the openings (41b) respectively exposing the via conductor connection pads 111. Therefore, when the release film 8 of the opening shape of the cavity 7 is formed by providing the adhesive layer 81 and the bonding layer 82 on the entire surface on the second surface (10S) side and then removing the adhesive layer 81 and the bonding layer 82 on the outer side of the formation region of the cavity 7, the adhesive layer 81 is also laminated on the via conductor connection pads 111. However, similar to the component mounting pads 110, a depth from the surface on the second surface (10S) side (the surface of the covering layer 41) to the one surfaces (111S) of the via conductor connection pads 111 is increased. Therefore, although a portion of the adhesive layer 81 can enter into recesses formed by the covering layer 41, the openings (41b) of the covering layer 41, and the one surfaces (111S) of the via conductor connection pads 111 exposed from the openings (41b), the covering layer 41 functions as a spacer, and the adhesive layer 81 entered into the recesses does not firmly adhere to the bottom surfaces of the recesses, that is, the one surfaces (111S) of the via conductor connection pads 111 and wall surfaces. When the adhesive layer 81 and the bonding layer 82 are removed, the adhesive layer 81 is satisfactorily peeled off from the one surfaces (111S) of the via conductor connection pads 111 without leaving residues or the like on the one surfaces (111S). Therefore, even when the via conductors 6 are connected to the via conductor connection pads 111 in the openings (41b), a connection failure is unlikely to occur.

In the case of the printed wiring board (1d) illustrated in FIG. 5, the covering layer 41 includes the multiple second covering parts 412. In forming the release film 8, similar to the above-described covering layer 41 formed on the peripheral edges of the component mounting pads 110 or the via conductor connection pads 111, the second covering parts 412 function as a spacer. That is, due to the second covering parts 412, the adhesive layer 81 is prevented from being firmly adhered to the surface on the second surface (10S) side on the outer side of the formation region of the cavity 7. Therefore, as described above, the multiple second covering parts 412 may be formed in any number at any positions. However, it is preferable that the multiple second covering parts 412 be appropriately dispersed on the second surface (10S) of the build-up layer 10 outside the formation region of the cavity 7. Peeling of an unwanted portion of the adhesive layer 81 can be easily performed. A peeling failure is unlikely to occur.

The release film 8 is provided so as to extend substantially over the entire formation region of the cavity 7. In the printed wiring board 1 of the example of FIG. 1, as described above, since the cavity 7 has a quadrangular opening shape, preferably, a release film 8 having a quadrangular planar shape is provided. A thickness of the release film 8 can be selected based on a thickness of the prepreg 520 (see FIG. 11H) laminated on the build-up layer 10 in a later process. Further, the release film 8 may be formed by only one layer, for example, the adhesive layer 81, or may have a three-layer structure including a middle layer between the adhesive layer 81 and the bonding layer 82. For example, the thickness of the release film 8 may be adjusted to a desired thickness by adjusting a thickness of the middle layer.

Subsequently, as illustrated in FIG. 11H, the prepreg 520 having an opening 521 based on the planar shape of the release film 8 is prepared. The prepreg 520 is mainly formed of a core material (52c) such as a glass fiber or an aramid fiber, and an insulating resin such as an epoxy resin impregnated in the core material (52c). The opening 521 can be formed by die processing or the like.

The thickness of the prepreg 520 is selected based on a thickness of the insulating layer 52 (see FIG. 11I) formed by the prepreg 520 in the reinforcement layer 5. Further, as described above, the thickness of the release film 8 is selected based on the thickness of the prepreg 520. The thickness of the release film 8 is, for example, 15 μm or more and 50 μm or less.

Further, a prepreg 510 having a shape substantially the same as the planar shape of the build-up layer 10 is prepared. The prepreg 510 can be formed of the same resin material and include the same core material (51c) as the prepreg 520. A thickness of the prepreg 510 is selected based on a thickness of the insulating layer 51 (see FIG. 11I) formed by the prepreg 510 in the reinforcement layer 5.

As illustrated in FIG. 11H, the prepreg 520 is laminated on the surface on the second surface (10S) side of the build-up layer 10. The prepreg 520 is laminated with the opening 521 and the release film 8 facing each other such that, after curing, the release film 8 fits inside the opening 521. Further, the prepreg 510 is laminated on the prepreg 520. The prepregs (510, 520) are cured by being heated and pressed. At the same time as the reinforcement layer 5 (see FIG. 11I) including the insulating layer 51 and the insulating layer 52 as the cured products of the prepregs (510, 520) is formed, the reinforcement layer 5 is bonded via the covering layer 41 to the build-up layer 10 having the covering layer 41 on the surface on the second surface (10S) side.

In the case of the printed wiring boards (1d, 1e) respectively illustrated in FIGS. 5 and 6, in the formation region of the cavity 7, as described above, the first covering part 411 is formed having a shape that covers the formation region of the cavity 7 but is larger than the formation region of the cavity 7. Therefore, the release film 8 is formed on the first covering part 411 and on the exposed one surfaces (110S) of the component mounting pads 110. Since the release film 8 has substantially the same size as the opening of the cavity 7, the protruding portion (41e) of the peripheral edge of the first covering part 411 is exposed without being covered by the laminated release film 8. The prepreg 520 having the opening 521 based on the planar shape of the release film 8 is laminated with the opening 521 and the release film 8 facing each other. Therefore, the prepreg 520 is laminated on the protruding portion (41e) of the first covering part 411 that is not covered by the release film 8. By laminating the prepreg 510 on the prepreg 520 and curing the prepregs (510, 520), the reinforcement layer 5 is formed on the protruding portion (41e). That is, by bonding the reinforcement layer 5 to the build-up layer 10, in the printed wiring boards (1d, 1e), the protruding portion (41e) of the first covering part 411 is sandwiched between the reinforcement layer 5 and the second surface (10S) of the build-up layer 10. Occurrence of a problem such as peeling of the covering layer 41 in the cavity 7 is prevented.

Next, as illustrated in FIG. 11I, the fourth conductor layer 14 is formed on the reinforcement layer 5 and the via conductors 6 are formed. First, conduction holes (5a) are formed, for example, by irradiating CO2 laser to the reinforcement layer 5 at positions corresponding to formation locations of the via conductors 6. The conduction holes (5a) penetrate the reinforcement layer 5 and the covering layer 41. Then, a metal film is formed in the conduction holes (5a) and on the surface of the reinforcement layer 5 (or, a metal foil composed of copper or the like laminated on the reinforcement layer 5 when the reinforcement layer 5 is formed) by electroless copper plating or the like. Further, using the metal film as a seed layer, an electrolytic plating film composed of copper or the like is formed using a pattern plating method. Thereafter, a resist used for pattern plating is removed, and the metal film (and the metal foil) exposed by the removal of the resist is removed. As a result, the fourth conductor layer 14 is formed including, in order from a side close to the first conductor layer 11, the metal foil (copper foil) layer 141, the metal film (electroless copper plating film) layer 142, the electrolytic plating film (electrolytic copper plating film) layer 143, and the desired conductor patterns. Further, the via conductors 6 are respectively formed in the conduction holes (5a). The via conductors 6 electrically connect the fourth conductor layer 14 and the first conductor layer 11 to each other. The laminate 2 is completed. In the example illustrated in FIG. 11I, the fourth conductor layer 14 includes a conductor pattern 140 in the formation region of the cavity 7 (see FIG. 11L). This may be advantageous in suppressing warpage of the printed wiring board during manufacturing. This may facilitate the formation of the cavity 7 (see FIG. 11L) by peeling off a portion of the reinforcement layer 5.

Next, as illustrated in FIG. 11J, the solder resist layer 43 is formed. The solder resist layer 43 is formed by forming a photosensitive epoxy resin or polyimide resin layer on the surfaces of the fourth conductor layer 14 and the reinforcement layer 5. Then, the openings (43a) are formed using a photolithography technology.

Figure 11K:
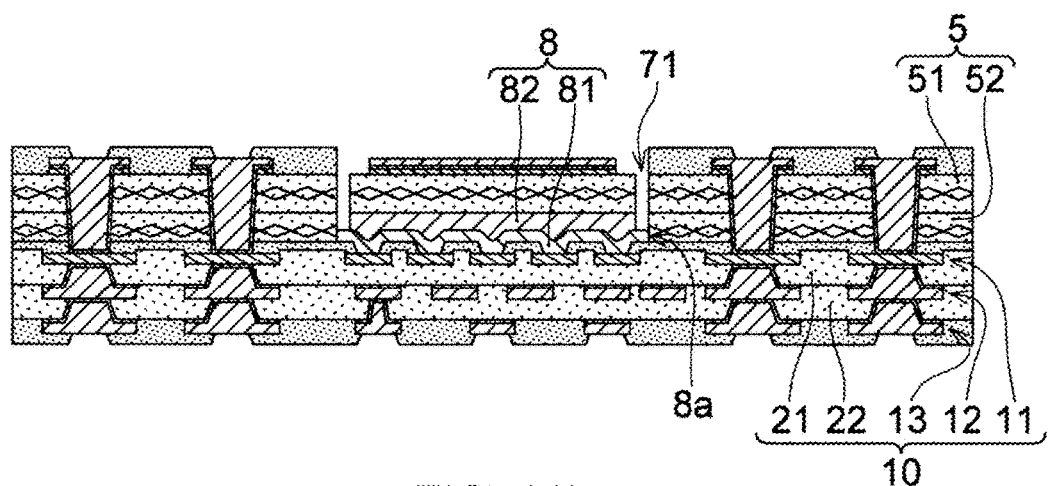

Next, as illustrated in FIG. 11K, the groove 71 penetrating the insulating layer 51 of the reinforcement layer 5 is formed along the peripheral edge of the release film 8 from a surface side of the reinforcement layer 5 on an opposite side with respect to the build-up layer 10. The groove 71 is formed toward the build-up layer 10 side of the reinforcement layer 5, and is formed along the entire circumference of the release film 8 so as to surround the formation region of the cavity 7 (see FIG. 11L). For example, laser is irradiated to the reinforcement layer 5 from the surface side of the reinforcement layer 5 on the opposite side with respect to the build-up layer 10 along a trajectory surrounding the formation region of the cavity 7. Examples of types of laser include, but not limited to, carbon dioxide gas laser, YAG laser, and the like. Further, the groove 71 may be formed by cutting such as drilling.

The groove 71 is preferably formed such that, among two opposing inner walls of the groove 71, the inner wall on an outer peripheral side is aligned with an outer edge (8a) of the release film 8. That is, the inner wall of the groove 71 on the outer peripheral side is a side wall of the cavity 7 (see FIG. 11L). When the wall surface of the cavity 7 is a tapered surface such that the opening shape of the cavity 7 is reduced in size toward the bottom surface of the cavity 7, a laser beam focused such that a spot diameter of the laser beam becomes smaller toward a front end side is used. By irradiating such a focused laser beam to form the groove 71, the groove 71 can be formed to have a desired tapered inner wall.

Figure 11L:
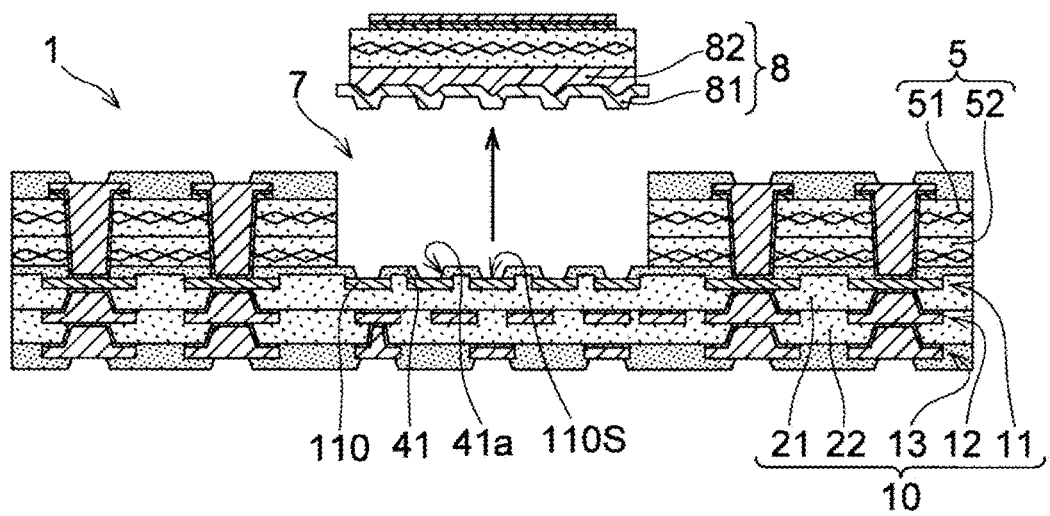

As illustrated in FIG. 11L, a portion of the reinforcement layer 5 surrounded by the groove 71 is removed together with the release film 8. As a result, the cavity 7 exposing the component mounting pads 110 on the bottom surface thereof is formed. The adhesive layer 81 of the release film 8 does not firmly adhere to the build-up layer 10 or the covering layer 41 or the like, but simply sticks thereto by its stickiness. Therefore, the removal can be easily performed using any method. For example, the removal is performed by sucking the surface of the reinforcement layer 5 to be removed to a jig tool or the like and pulling up the reinforcement layer 5 to an opposite side with respect to the build-up layer 10. Further, as described above, due to the covering layer 41 which is provided such that the openings (41a) are formed, the adhesive layer 81 sticks to the one surfaces (110S) of the component mounting pads 110 without being firmly adhered thereto. Therefore, the adhesive layer 81 can be peeled off without remaining on the one surfaces (110S) of the component mounting pads 110.

Figure 3:
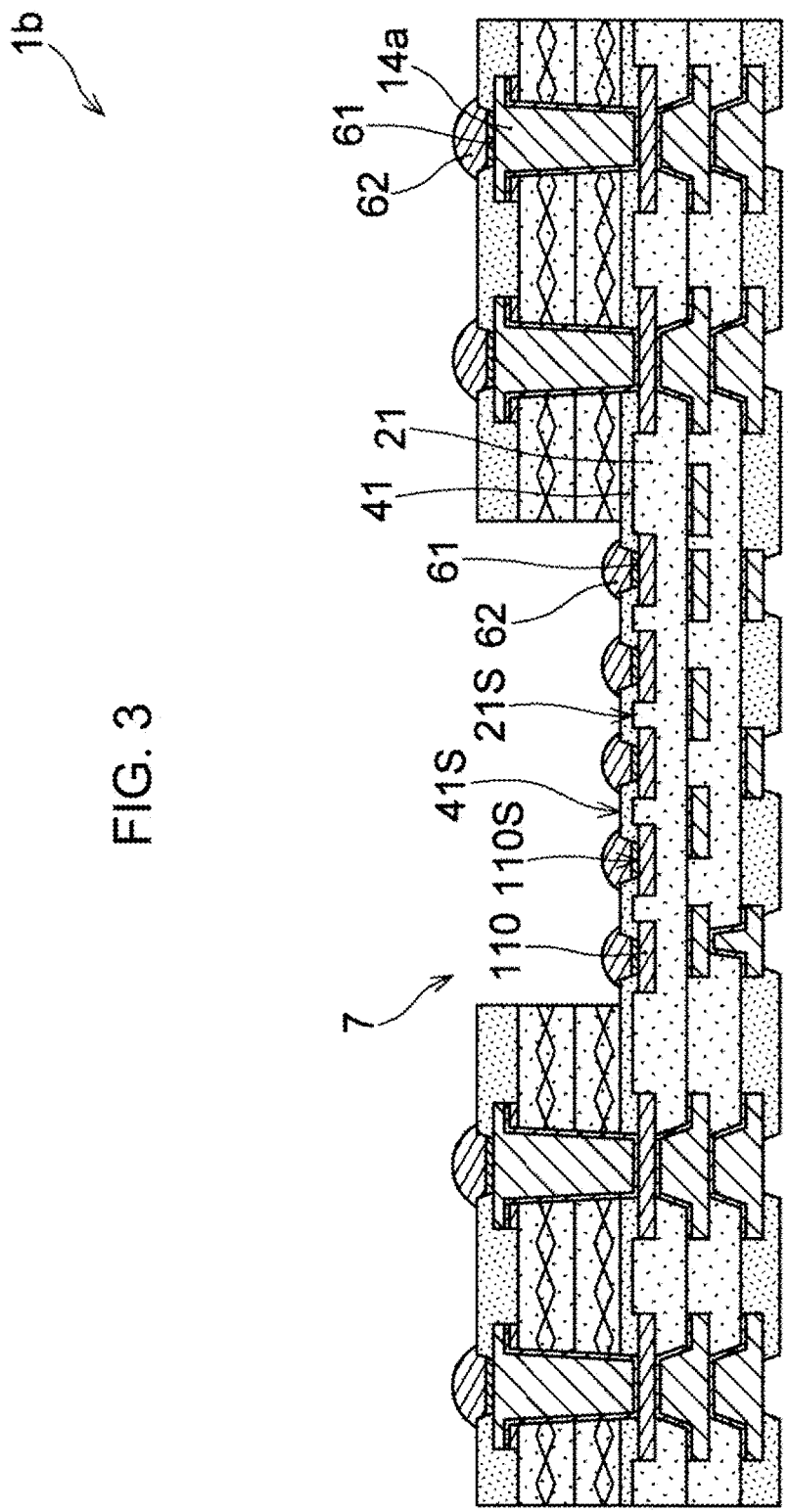
FIG. 3 is a cross-sectional view illustrating a printed wiring board according to another embodiment of the present invention.

After the cavity 7 is formed, residues of resin materials of the release film 8, the reinforcement layer 5 and the like that can remain in the cavity 7 may be removed using oxygen plasma or a solvent. Further, for example, as in the case where the printed wiring board (1b) illustrated in FIG. 3 is manufactured, a protective film may be formed on each of the component mounting pads 110 and the upper side and lower side connection pads (14a, 13a). For example, a protective film composed of Ni/Au, Ni/Pd/Au, Sn or the like can be formed by plating. An OSP may be formed by immersion in a liquid organic material or by spraying an organic material. Through the above processes, the printed wiring board 1 which is an example of the present embodiment illustrated in FIG. 1 is completed.

It is also possible that the reinforcement layer 5 of the printed wiring board 1 is not formed from two prepreg layers. For example, the reinforcement layer 5 may be formed from an insulating plate and a prepreg for bonding the insulating plate to the build-up layer 10. A method for manufacturing such a printed wiring board (1f) is described below.

Figure 12A:
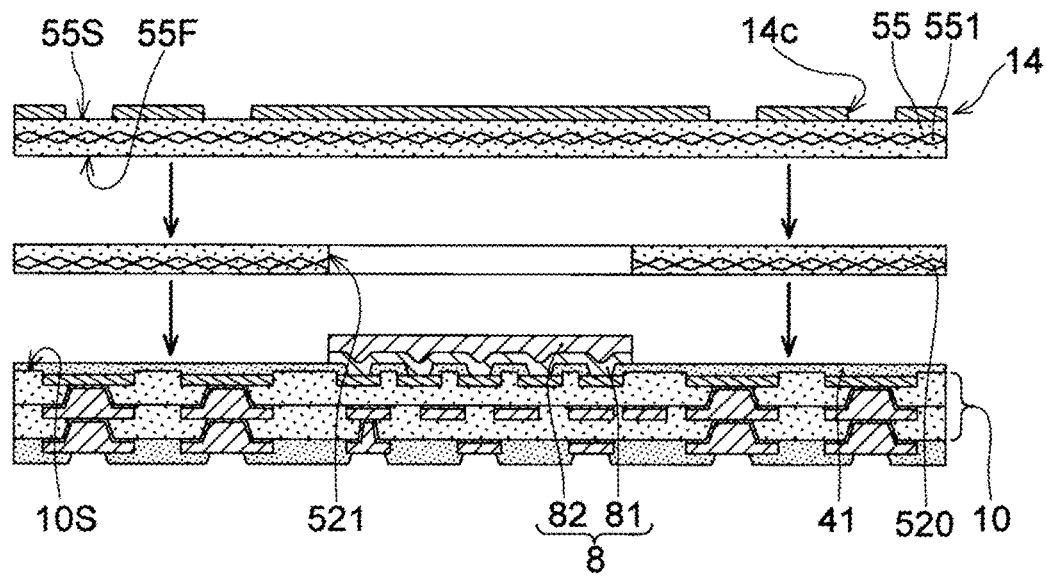
FIG. 12A-12F illustrate a method for manufacturing a printed wiring board according to an embodiment of the present invention.
Figure 12B:
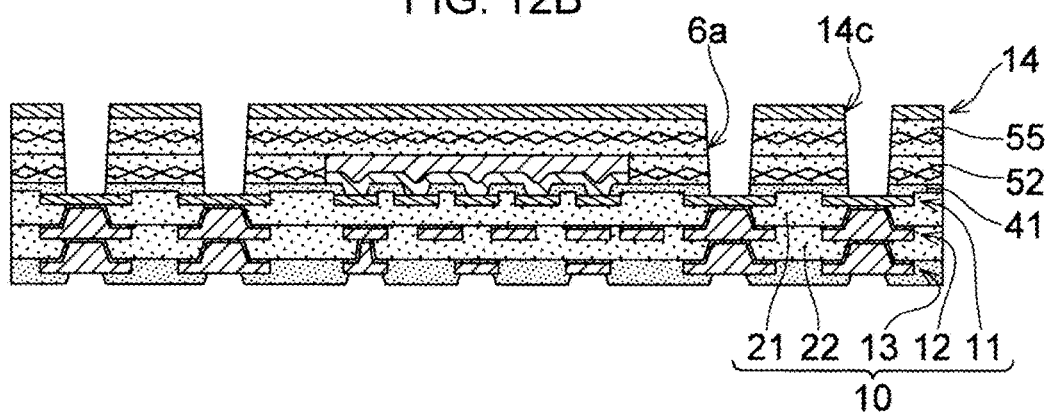
Figure 12C:
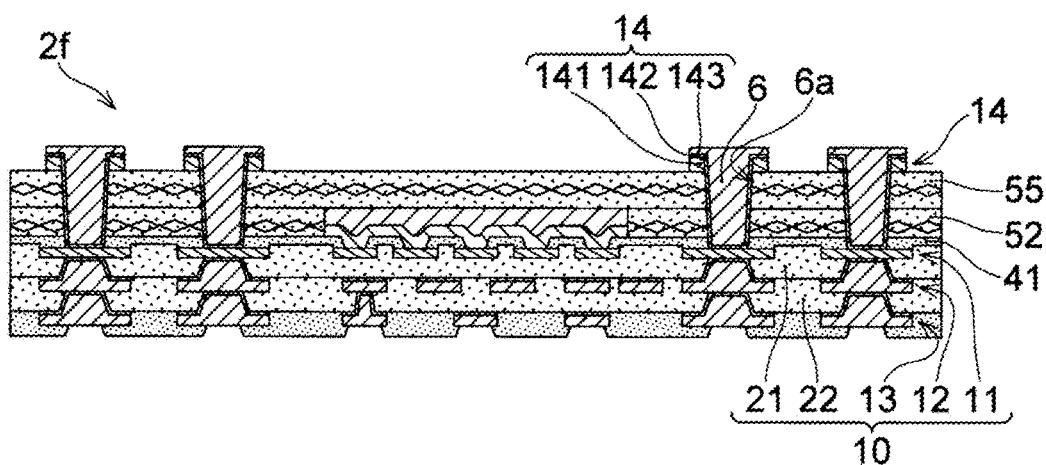

As illustrated in FIG. 12A, an insulating plate 55 is prepared having a first surface (55F) and a second surface (55S) which is an opposite surface of the first surface (55F) and having a fourth conductor layer 14 on the second surface (55S). For example, an insulating plate 55 formed using any insulating resin such as an epoxy resin, a BT resin, a phenol resin or the like is prepared. Preferably, the insulating plate 55 contains a core material 551 composed of a glass fiber, an aramid fiber or the like. The fourth conductor layer 14 is formed using any metal foil, and, preferably, the fourth conductor layer 14 is formed from a copper foil. In the fourth conductor layer 14, desirable conductor patterns are formed, for example, by etching. For example, by patterning a copper foil on both sides of a double-sided copper-clad laminated plate, an insulating plate 55 having a fourth conductor layer 14 can be prepared. The fourth conductor layer 14 illustrated in FIGS. 12A and 12B is formed only by the copper foil layer 141 illustrated in FIG. 1. In the process of FIG. 12C to be described later, a fourth conductor layer 14 in a final state having an electroless copper plating film layer 142 and an electrolytic copper plating film layer 143 is formed.

Further, openings (14c) having sizes based on cross sections of via conductors 6 (see FIG. 12C) to be formed in a later process may be formed in the fourth conductor layer 14 of the insulating plate 55. The openings (14c) are formed by removing conductors of portions corresponding to formation positions of the via conductors 6. The openings (14c) facilitate the formation of the via conductors 6.

Subsequently, a prepreg 520 having an opening 521 based on the planar shape of the release film 8 is prepared. A thickness of the prepreg 520 may be appropriately selected based on a thickness of an insulating layer 52 (see FIG. 12B) formed by the prepreg 520 in the reinforcement layer 5.

As illustrated in FIG. 12A, the prepreg 520 is laminated on the surface on the second surface (10S) side of the build-up layer 10. The prepreg 520 is laminated with the opening 521 and the release film 8 facing each other such that, after curing, the release film 8 fits inside the opening 521. Further, the insulating plate 55 is laminated on the prepreg 520 with the first surface (55F) facing the prepreg 520. Then, the prepreg 520 is cured by being heated and pressed, and the insulating layer 52 (see FIG. 12B) as a cured product thereof is formed. At the same time, the build-up layer 10 with the covering layer 41 formed on the surface on the second surface (10S) side thereof and the insulating plate 55 are bonded to each other via the insulating layer 52.

As illustrated in FIGS. 12B and 12C, the via conductors 6 penetrating the insulating plate 55, the insulating layer 52 and the covering layer 41 and connecting the fourth conductor layer 14 and the first conductor layer 11 to each other are formed. First, as illustrated in FIG. 12B, conduction holes (6a) are formed at formation positions of the via conductors 6 by irradiating CO2 laser or the like from the fourth conductor layer 14 side. The laser is preferably irradiated toward the openings (14c) formed in the fourth conductor layer 14. The conduction holes (6a) exposing the first conductor layer 11 can be easily formed. The conduction holes (6a) penetrate the fourth conductor layer 14, the insulating plate 55, the insulating layer 52, and the covering layer 41, and are each reduced in diameter toward the first conductor layer 11.

Thereafter, a metal film is formed on inner walls of the conduction holes (6a) and on the entire surface of the fourth conductor layer 14 by electroless plating or sputtering. A plating resist having openings exposing at least the conduction holes (6a) is formed on the metal film, and an electrolytic plating film is formed in the conduction holes (6a) using the metal film as a seed layer. Preferably, an additive added to a plating solution is adjusted such that precipitation of the electrolytic plating film in the conduction holes (6a) is promoted more than other portions. Thereafter, the plating resist is removed, and the metal film exposed by the removal of the plating resist is removed. Further, in the fourth conductor layer 14, a portion exposed by the removal of the metal film is removed. As illustrated in FIG. 12C, the conduction holes (6a) are filled with the electrolytic plating film, and the via conductors 6 are respectively formed in the conduction holes (6a).

Figure 12D:
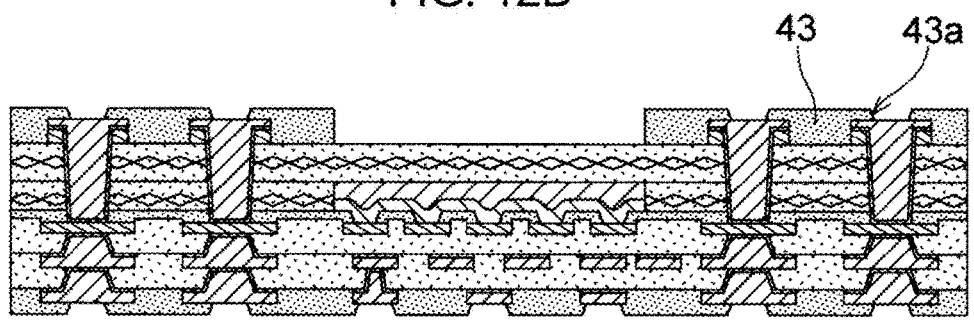

Through the process of FIG. 12C, the fourth conductor layer 14 in a final state is formed by a metal foil layer 141 illustrated as a single-layer fourth conductor layer 14 in FIGS. 12A and 12B, and two layers of films (142, 143) formed on the metal foil layer 141. FIG. 12C is an example of a fourth conductor layer 14 having a three-layer structure including the copper foil layer 141, the electroless copper plating film layer 142 which is a remaining portion of an electroless copper plating film used as a seed layer, and an electrolytic copper plating film layer 143. Thereafter, when necessary, a thickness of the fourth conductor layer 14 may be adjusted by chemical mechanical polishing or etching. In the example of FIG. 12C, the fourth conductor layer 14 in the formation region of the cavity 7 (see FIG. 12F) is entirely removed. In this way, not providing a conductor pattern near an edge of the formation region of the cavity 7 may be preferable because formation of a groove by laser irradiation or the like when the cavity 7 is formed is not inhibited. The laminate (2f) is completed.

Figure 12E:
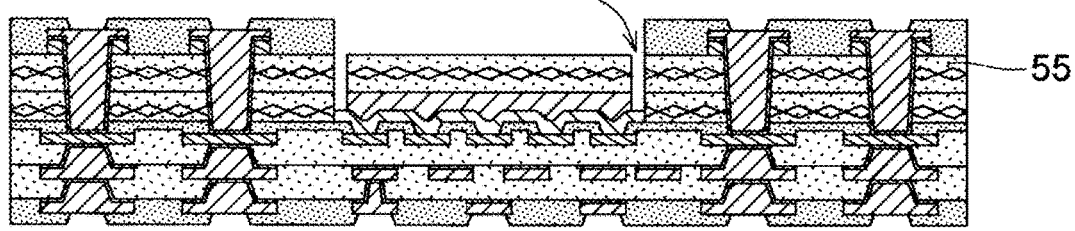
Figure 12F:
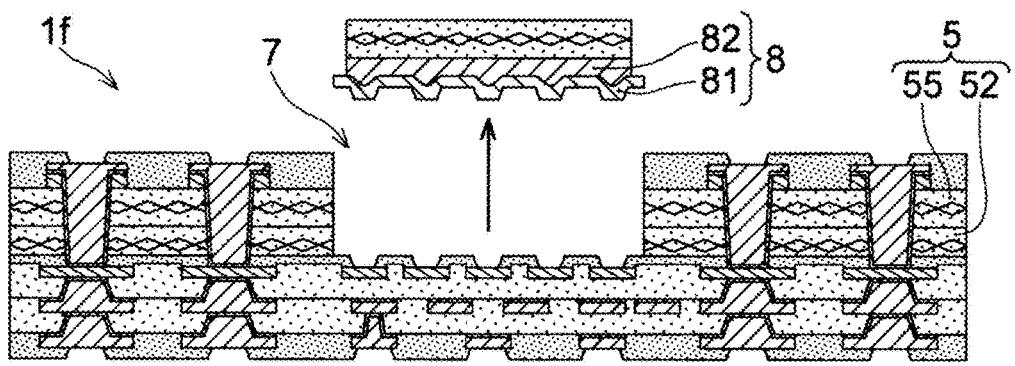

Thereafter, by performing the same processes as those illustrated in FIG. 11J-11K, the solder resist layer 43 having the openings (43a) is formed (FIG. 12D), and the groove 71 surrounding the formation region of the cavity 7 (see FIG. 12F) is formed penetrating the insulating plate 55 by irradiating laser or the like (FIG. 12E). Next, the cavity 7 is formed by removing a portion of the insulating plate 55 surrounded by the groove 71 together with the release film 8. The printed wiring board (1f), which is a modified embodiment of the printed wiring board 1 and in which the reinforcement layer 5 is formed from the insulating plate 55 and the insulating layer 52, is completed.

A printed wiring board according to an embodiment of the present invention is not limited to those having the structures exemplified in the drawings, or the structures or materials exemplified in the present specification. For example, the build-up layer 10 may have any number of conductor layers and insulating layers. Any number of conductor layers and insulating layers may be laminated on the reinforcement layer 5 on the opposite side with respect to the build-up layer 10. Further, a method for manufacturing a printed wiring board according to an embodiment of the present invention is not limited to the methods described with reference to the drawings. Conditions, processing order and the like of the methods may be appropriately modified. Depending on a structure of an actually manufactured printed wiring board, some of the processes may be omitted, or other processes may be added.

In the printed wiring board of Japanese Patent Laid-Open Publication No. 2016-86024, on the bottoms of the mounting via conductors that are formed to be recessed relative to a resin insulating layer forming the bottom surface of the cavity, the connection pads are respectively formed by forming a surface treatment layer so as to protrude from the resin insulating layer. It is thought that insulation between the pads is insufficient and there is a risk that a short-circuit defect may occur.

A printed wiring board according to an embodiment of the present invention includes: a build-up layer that has a first surface and a second surface on an opposite side with respect to the first surface and is formed by one or more insulating layers and two or more conductor layers that are laminated on both sides of and sandwich the insulating layers; a reinforcement layer that is bonded to the second surface side of the build-up layer; a first conductor layer that includes at least one component mounting pad formed on the second surface of the build-up layer and is embedded in an insulating layer forming the second surface of the build-up layer and has one surface exposed on the second surface side; a covering layer that covers an outermost insulating layer on the second surface side of the build-up layer and has an opening exposing one surface of the at least one component mounting pad; a fourth conductor layer that is formed on the reinforcement layer; a cavity that is formed in the reinforcement layer and exposes the at least one component mounting pad and the covering layer; and a via conductor that penetrates the reinforcement layer and electrically connects the first conductor layer and the fourth conductor layer to each other.

A method for manufacturing a printed wiring board according to another embodiment of the present invention is a method for manufacturing a printed wiring board having a cavity. The method includes: preparing a laminate that includes at least: a reinforcement layer; a build-up layer in which a covering layer is provided on one surface thereof and that includes one or more insulating layers and two or more conductor layers that are laminated on both sides of and sandwich the insulating layers; and a release film that allows a portion of the reinforcement layer and the build-up layer to be easily peeled off from each other; forming a groove penetrating the reinforcement layer along a peripheral edge of the release film over an entire circumference of the release film from a surface of the reinforcement layer on an opposite side with respect to the build-up layer; and forming the cavity by removing a portion of the reinforcement layer surrounded by the groove together with the release film.

According to an embodiment of the present invention, a highly reliable printed wiring board can be provided in which a short-circuit defect between component mounting pads in a cavity is prevented.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a build-up layer comprising an insulating layer and a first conductor layer embedded in the insulating layer and including a component mounting pad;
   a covering layer formed on the build-up layer such that the covering layer is covering the insulating layer of the build-up layer and has an opening exposing the component mounting pad;
   a reinforcement layer formed on the covering layer and having a cavity penetrating through the reinforcement layer such that the cavity is exposing the component mounting pad in the build-up layer and the covering layer on the build-up layer;
   a conductor layer formed on the reinforcement layer such that the conductor layer is on an opposite side with respect to the covering layer on the build-up layer; and
   a via conductor formed in the reinforcement layer such that the via conductor electrically connects the first conductor layer in the build-up layer and the conductor layer on the reinforcement layer,
   wherein the first conductor layer is embedded in the insulating layer forming a surface of the build-up layer such that the first conductor layer has a surface exposed on the surface of the build-up layer.

2. The printed wiring board according to claim 1, wherein the covering layer is formed between the build-up layer and the reinforcement layer such that the covering layer is formed on the surface of the build-up layer and that the reinforcement layer is formed on a surface of the covering layer.

3. The printed wiring board according to claim 1, wherein the covering layer is formed on an entire portion of the surface of the build-up layer except for a surface of the component mounting pad exposed by the opening of the covering layer.

4. The printed wiring board according to claim 2, wherein the via conductor is formed such that the via conductor is penetrating through the covering layer formed between the surface of the build-up layer and the reinforcement layer.

5. The printed wiring board according to claim 1, wherein the first conductor layer is embedded in the insulating layer such that the surface of the first conductor layer is recessed relative to the surface of the build-up layer.

6. The printed wiring board according to claim 1, wherein the build-up layer is a coreless substrate.

7. The printed wiring board according to claim 1, wherein the covering layer is a solder resist layer.

8. The printed wiring board according to claim 1, wherein the insulating layer of the build-up layer includes a core material.

9. The printed wiring board according to claim 1, wherein the via conductor has a tapered shape having a diameter decreasing toward the first conductor layer.

10. The printed wiring board according to claim 1, wherein the build-up layer comprises a plurality of insulating layers including the insulating layer, and a plurality of conductor layers including the first conductor layer, and the component mounting pad is formed in a plurality in the first conductor layer such that the plurality of component mounting pads is positioned to mount an electronic component in the cavity of the reinforcement layer.

11. The printed wiring board according to claim 3, wherein the first conductor layer is embedded in the insulating layer such that the surface of the first conductor layer is recessed relative to the surface of the build-up layer.

12. The printed wiring board according to claim 3, wherein the build-up layer is a coreless substrate.

13. The printed wiring board according to claim 3, wherein the covering layer is a solder resist layer.

14. The printed wiring board according to claim 3, wherein the insulating layer of the build-up layer includes a core material.

15. The printed wiring board according to claim 3, wherein the via conductor has a tapered shape having a diameter decreasing toward the first conductor layer.

* * * * *